United States Patent
Sato et al.

(10) Patent No.: US 6,344,951 B1
(45) Date of Patent: Feb. 5, 2002

(54) SUBSTRATE HAVING MAGNETORESISTIVE ELEMENTS AND MONITOR ELEMENT CAPABLE OF PREVENTING A SHORT CIRCUIT

(75) Inventors: Kiyoshi Sato; Katsuya Sugai, both of Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/456,151

(22) Filed: Dec. 7, 1999

(30) Foreign Application Priority Data

Dec. 14, 1998 (JP) .......................................... 10-354341
Dec. 24, 1998 (JP) .......................................... 10-366330

(51) Int. Cl.[7] ................................................ G11B 5/39
(52) U.S. Cl. ........................................................ 360/316
(58) Field of Search .............................. 360/316; 451/5, 451/8; 29/603.1

(56) References Cited

U.S. PATENT DOCUMENTS 5,588,199 A   12/1996  Krounbi et al.
5,701,221 A * 12/1997  Taniyama et al.
5,913,550 A *  6/1999  Watanuki

* cited by examiner

Primary Examiner—Craig A. Renner
(74) Attorney, Agent, or Firm—Brinks Hofer Gilson & Lione

(57) ABSTRACT

Height setting processing performed while measuring DC resistance of a monitor element formed on a substrate causes smearing (sag) in shielding layers formed above and below the monitor element with gap layers held therebetween, causing a short circuit between the monitor element and the shielding layers due to smearing. A recessed portion is formed in a lower shielding layer formed on the substrate, and an insulating layer is formed in the recessed portion. The monitor element is formed on the insulating layer with a lower gap layer formed therebetween. The formation of the insulating layer increases the distance between the monitor element and the lower shielding layer, thereby preventing electrical connection even when smearing occurs in the lower shielding layer. Alternatively, the monitor element is formed on the substrate with the lower gap layer formed therebetween, and the lower shielding layer formed below magnetoresistive elements is not formed below the monitor element. This prevents electrical connection between the lower shielding layer and the monitor element due to smearing, thereby preventing a short circuit in the monitor element during height setting processing.

17 Claims, 13 Drawing Sheets

SUBSTRATE HAVING MAGNETORESISTIVE ELEMENTS AND MONITOR ELEMENT CAPABLE OF PREVENTING A SHORT CIRCUIT

BACKGROUND OF THE INVENTION

1. Field of the Invention

The present invention relates to a substrate comprising magnetoresistive elements exhibiting a magnetoresistive effect, and a monitor element which is formed in the same structure as the magnetoresistive elements, for measuring the direct-current resistance value of the magnetoresistive element, wherein the structure of gap layers formed on and below the monitor element is improved to prevent a short circuit of the monitor element in measurement of direct-current resistance. The present invention also relates to a method of manufacturing the substrate, and a method of processing the substrate.

2. Description of the Related Art

FIG. 34 is a partial sectional view of a conventional substrate comprising magnetoresistive elements as viewed from the ABS side.

As shown in FIG. 34, a base insulating layer 13 made of $Al_2O_3$ is formed on a substrate 1 made of, for example, $Al_2O_3$—TiC (alumina-titanium carbide). A lower shielding layer 12 made of a magnetic material such as an NiFe alloy or the like is formed on the base insulating layer 13, and a lower gap layer 3 made of an insulating material such as $Al_2O_3$ or the like is formed on the lower shielding layer 12.

Referring to FIG. 34, a plurality of magnetoresistive elements 4 and a monitor element 5 are formed in a line in the ABS direction (the X direction shown in the drawing) on the lower gap layer 3 (the drawing does not show an inductive head).

In FIG. 34, a multilayer film 6 comprising a spin valve film (a GMR element), for example, composed of an anti-ferromagnetic layer, a pinned magnetic layer, a nonmagnetic conductive layer, and a free magnetic layer is formed at the center of each of the magnetoresistive elements 4. The pin valve film serves as an element using the giant magnetoresistive effect so that electric resistance changes with changes in a leakage magnetic field from a recording medium to detect recording signals. As shown in FIG. 34, electrode layers 7 made of a nonmagnetic metal material such as chromium (Cr) or the like are formed on both sides of the multilayer film 6.

The monitor element 5 is also formed in the same structure as the magnetoresistive elements 4. Namely, a multilayer film 8 exhibiting the magnetoresistive effect is formed at the center of the monitor element 5, and electrode layers 9 made of chromium (Cr) are formed on both sides of the multilayer film 8. The magnetoresistive elements 4 and the monitor element 5 are simultaneously formed on the lower gap layer 3 by pattering.

As shown in FIG. 34, an upper gap layer 10 made of an insulating material such as $Al_2O_3$ is formed on the magnetoresistive elements 4 and the monitor element 5, and an upper shielding layer 11 made of a NiFe alloy (permalloy) is further formed on the upper gap layer 10.

The monitor element 5 functions as a so-called processing monitor provided for setting a predetermined value of direct-current resistance (DCR) of the plurality of magnetoresistive elements 4 formed in alignment with the monitor element 5. After the monitor element 5 plays the role of the processing monitor, it is removed.

In order to set the direct-current resistance of the magnetoresistive elements 4 to the predetermined value, the ABS side (in the X direction shown in the drawing) of the magnetoresistive elements 4 and the monitor element 5 is ground (height setting), while measuring the direct-current resistance between the electrode layers 9 which constitute the monitor element 5. Then, when a predetermined direct-current valve is obtained, grinding of the ABS side is finished.

As described above, since the plurality of magnetoresistive elements 4 and the monitor element 5 have the same structure and are formed in a line parallel to the ABS side, the magnetoresistive elements 4 and the monitor element 5 have the same dimension in the height direction (the Y direction shown in FIG. 34). Therefore, the plurality of magnetoresistive elements 4 and the monitor element 5 can be set to the same direct-current resistance value by grinding the ABS side.

Namely, when the direct-current resistance of the monitor element 5 reaches a predetermined value by grinding, the direct-current resistance of the magnetoresistive elements also reaches the predetermined value.

However, in grinding the ABS side of the magnetoresistive elements 4 and the monitor element 5 while measuring the direct-current resistance between the electrode layers 9 which constitute the monitor element 5, the shielding layers 11 and 12 and the-electrode layers 9, which are exposed from the ABS side, cause smearing (sags) to cause electrical contact between the electrode layers 7 and the shielding layers 11 and 12, thereby short-circuiting the electrode layers 7 and the shielding layers 11 and 12.

For example, where sags 12a occur in the lower shielding layer 12 formed below the monitor element 5, as shown in FIG. 35, electrical connection occurs between the sags 12a and the electrode layers 9. As a result, the direct-current resistance (DCR) between the electrode layer 9 of the monitor element 5 cannot be precisely measured, and thus the dimensions of the magnetoresistive elements 4 in the height direction (the Y direction shown in FIG. 35) cannot be set to a value with which the direct-current resistances are a predetermined value.

Particularly, it is confirmed that the above problem significantly occurs when the gap length G1 determined by the thickness of the lower gap layer 3, and the gap length G2 determined by the thickness of the upper gap layer 10 are 700 angstroms or less.

In grinding the ABS side, sags 12a occur not only between the electrode layers 9 of the monitor element 5 and the shielding layers 11 and 12, but also in the electrode layers 7 of the magnetoresistive elements 4, and in the lower shielding layer 12 formed below the magnetoresistive elements 4, for example, as shown in FIG. 35, causing electrical connection between the electrode layers 7 of the magnetoresistive elements 4 and the shielding layer 12. However, after grinding is finished, the ABS side of the magnetoresistive elements 4 is lapped to remove the sags of the electrode layers 7 and the shielding layers 11 and 12, thereby maintaining an electrical insulation state between the electrode layers 7 of the magnetoresistive elements 4 and the shielding layers 11 and 12 in a magnetic head product.

SUMMARY OF THE INVENTION

The present invention has been achieved for solving the above problem, and an object of the present invention is to provide a substrate comprising magnetoresistive elements, which is capable of preventing a short circuit between electrode layers of a monitor element and shielding layers, and precisely measuring direct-current resistance during height setting processing, a method of manufacturing the substrate, and a method of processing the substrate.

The present invention provides a substrate comprising a lower shielding layer formed on the substrate, a lower gap layer formed on the lower shielding layer, a plurality of magnetoresistive elements each comprising a multilayer film exhibiting the magnetoresistive effect and electrode layers conducting to the multilayer film, and a processing monitor element having substantially the same structure as the magnetoresistive elements, these elements being arranged in a line on the lower gap layer, wherein besides the lower gap layer, an insulating layer is formed between the monitor element and the lower shielding layer to be exposed from the ABS side so that the distance between the monitor element and the lower shield layer exposed from the ABS side is larger than the distance between the magnetoresistive elements and the lower shield layer exposed from the ABS side.

In the present invention, the total thickness of the lower gap layer and the insulating-layer is preferably 700 angstroms or more.

A typical structure of the substrate of the present invention preferably comprises the insulating layer formed on the lower shielding layer, the lower gap layer formed on the insulating layer, and the monitor element formed on the lower gap layer.

In a preferred example of such a structure, a recessed portion is formed in the surface of the lower shielding layer, an insulating layer is formed in the recessed portion, and the monitor element is formed on the insulating layer with the lower gap layer provided therebetween.

The surface of the insulating layer formed in the recessed portion of the lower shielding layer, and the surface of the lower shielding layer are preferably formed in the same plane.

In the present invention, the insulating layer may formed on the surface of the lower shielding layer to form steps between the upper surface of the insulating layer and the surface of the lower shielding layer, so that inclined surfaces may be formed on the sides of the insulating layer in the stepped portions.

In the present invention, the insulating layer is preferably made of any one of insulating materials such as $SiO_2$, $Ta_2O_5$, $TiO$, $Al_2O_3$, $Si_3N_4$, $AlN$, and $WO_3$.

In the present invention, the insulating layer may also be formed below the electrode layers of the magnetoresistive elements in a region excluding portions below the multilayer films which respectively constitutes the magnetoresistive elements.

The present invention also provides a substrate comprising a lower shielding layer formed on the substrate, a lower gap layer formed on the lower shielding layer, a plurality of magnetoresistive elements each comprising a multilayer film exhibiting the magnetoresistive effect and electrode layers conducting to the multilayer film, and a processing monitor element having substantially the same structure as the magnetoresistive elements, these elements being arranged in a line on the lower gap layer, wherein besides an upper gap layer, an insulating layer is formed on the magnetoresistive elements and the monitor element to be exposed from the ABS side so that the distance between the monitor element and an upper shielding layer exposed from the ABS side is larger than the distance between the magnetoresistive elements and the upper shielding layer exposed from the ABS side.

In the present invention, the total thickness of the upper gap layer and the insulating layer is preferably 700 angstroms or more.

The insulating layer may also be formed on the electrode layers which constitute the magnetoresistive elements in a region excluding portions above the multilayer films which respectively constitute the magnetoresistive elements.

The insulating layer overlapped with the electrode layers of the magnetoresistive elements may be formed to be exposed from the ABS side.

The present invention further provides a method of manufacturing a substrate comprising magnetoresistive elements, the method comprising the steps of forming a lower shielding layer on the substrate, and then forming a lift off resist layer on the lower shielding layer; etching to a predetermined depth a portion of the surface of the lower shielding layer, on which the resist layer is not formed, to form a recessed portion in the surface of the lower shielding layer; forming an insulating layer in the recessed portion formed in the surface of the lower shielding layer and then removing the resist layer; forming a lower gap layer on the lower shielding layer and the insulating layer; and forming a plurality of magnetoresistive elements each comprising a multilayer film exhibiting the magnetoresistive effect and electrode layers conducting to the multilayer film on a portion of the lower gap layer on which the insulating layer is not formed, and a processing monitor element having substantially the same structure as the magnetoresistive elements on a portion of the lower gap layer on which the insulating layer is formed, so that these elements are arranged in a line.

In the present invention, the recessed portion formed in the surface of the lower shielding layer may also be formed in a portion where the electrode layers of the magnetoresistive elements are formed, so that after the insulating layer is formed in the recessed portions, the electrode layers of the magnetoresistive elements are formed on the lower gap layer overlapped with the insulating layer.

In the present invention, the recessed portions formed in the surface of the lower shielding layer are preferably formed below the electrode layers behind at least the multilayer films of the magnetoresistive elements.

The present invention further provides a method of manufacturing a substrate comprising magnetoresistive elements, the method comprising the steps of forming a lower shielding layer on the substrate, and then forming a insulating material layer on the lower shielding layer; forming a resist layer on the insulating material layer and etching off a portion of the insulating layer, which is not covered with the resist layer, to leave the insulating material layer below the resist layer as an insulating layer; removing the resist layer and forming a lower gap layer on the insulating layer and the lower shielding layer; and forming a plurality of magnetoresistive elements each comprising a multilayer film exhibiting the magnetoresistive effect and electrode layers conducting to the multilayer film on a portion the lower gap layer where the insulating layer is not formed, and a processing monitor element having substantially the same structure as the magnetoresistive elements on a portion of the lower gap layer where the insulating layer is formed, so that these elements are arranged in a line.

In the present invention, the insulating layer may also be formed below the electrode layers of the magnetoresistive elements, so that the electrode layers of the magnetoresistive elements are formed on the lower gap layer overlapped with the insulating layer.

In the present invention, the insulating layer formed below the electrode layers of the magnetoresistive elements may be exposed from the ABS side.

In the present invention, inclined surfaces are preferably formed on the sides of the insulating layer.

In the present invention, inclined surfaces are preferably formed on the sides of the insulating layer by isotropic etching.

Alternatively, the resist layer is formed on the insulating material layer, and then heat-treated to form inclined surfaces on the sides of the resist layer, and an inclined layer is preferably formed on the sides of the insulating layer left below the resist layer by isotropic etching.

In the present invention, the insulating material layer is preferably made of any one of insulating materials such as $SiO_2$, $Ta_2O_5$, $TiO$, $Al_2O_3$, $Si_3N_4$, $AlN$, and $WO_3$.

The present invention further provides a method of processing a substrate comprising magnetoresistive elements, the method comprising grinding the magnetoresistive elements and a monitor element from the ABS side in the height direction while measuring the direct-current resistance value between electrode layers of the monitor element until a predetermined direct-current resistance value is obtained.

IA magnetic head slider comprising a magnetoresistive element composed of a spin valve film (a GMR element) is formed, by various kinds of processing, from a wafer in which a plurality of magnetoresistive elements are formed.

The exposed surface of the magnetoresistive element formed in the slider is referred to as "the ABS side", which is opposed to a recording medium in reproducing-signals from the recording medium. The direction perpendicular to the ABS side opposed to the recording medium, i.e., the direction away from the recording medium, is referred to as "the height direction". The length of the magnetoresistive element in the height direction is a very important dimension for determining the direct-current resistance of the magnetoresistive element.

In order to set the length of the magnetoresistive element in the height direction to a predetermined dimension by grinding (height setting processing) on the basis of the relation to the direct-current resistance, a monitor element having the same structure of the magnetoresistive element is formed in alignment with magnetoresistive elements formed on the substrate, and the ABS side of the magnetoresistive elements and the monitor element is subjected to height setting processing, while measuring the direct-current of the monitor element. At the time the predetermined direct-current resistance is obtained, height setting processing is finished to form the magnetoresistive elements each having a length in the height direction with the predetermined direct-current resistance.

However, at present, the thickness of each of the gap layers formed on and below the monitor layer decreases as the recording density increases, and thus smearing (sagging) occurs in the shielding layers formed on and below the gap layers to be exposed from the ABS side in height setting processing. There is thus the problem of causing a short circuit between the monitor element and the shielding layers on the ABS side during measurement of direct-current resistance.

Particularly, in height setting processing, the ABS side of the monitor element is ground in the direction from the lower shielding layer formed below the monitor element to the upper shielding layer formed above the monitor element, and the thickness of the lower gap layer formed below the monitor element is actually smaller than the thickness of the upper gap layer formed on the monitor element. Therefore, smearing in the lower shielding layer causes the great problem of readily producing electrical connection between the lower shielding layer and the monitor element on the ABS side.

Accordingly, in the present invention, besides the lower gap layer, an insulating layer is provided between the monitor element and the lower shielding layer to increase the space between the monitor element and the lower shielding layer, as compared with a conventional substrate, so that even when smearing occurs in the lower shielding layer exposed from the ABS side, the occurrence of electrical connection between the monitor element and the lower shielding layer can be prevented.

The present invention further provides a substrate comprising a lower shield layer formed on the substrate, a lower gap layer formed on the lower shield layer, a plurality of magnetoresistive elements formed on the lower gap layer and each comprising a multilayer film exhibiting the magnetoresistive effect, and electrode layers conducting to the multilayer film, and a processing monitor element formed adjacent to the plurality of magnetoresistive elements and having substantially the same structure as the magnetoresistive elements, wherein the monitor element is formed on a portion of the substrate where the lower shielding layer is not formed, with the lower gap layer formed between the monitor element and the substrate.

In the present invention, an insulating layer is preferably formed between the substrate and the lower gap layer formed below the monitor element.

The surfaces of the insulating layer and the lower shielding layer are preferably formed in the same plane.

In the present invention, an upper shielding layer formed on the magnetoresistive elements with an upper gap layer provided therebetween is preferably not formed on a portion of the upper gap layer which is formed on the monitor element.

In the present invention, a write gap layer of an inductive head is preferably formed on the upper gap layer formed on the monitor element.

The present invention further provides a method of manufacturing a substrate comprising magnetoresistive elements, the method comprising the steps of forming a lower shielding layer on the substrate and then forming a lower gap layer on the lower shielding layer and the substrate on which the lower shielding layer is not formed; and forming a plurality of magnetoresistive elements each comprising a multilayer film exhibiting the magnetoresistive effect and electrode layers conducting to the multilayer film on a portion of the lower gap layer where the lower shielding layer is formed, and a processing monitor element having substantially the same structure as the magnetoresistive elements on a portion of the lower gap layer where the lower shielding layer is not formed, so that these elements are arranged in a line.

The present invention further provides a method of manufacturing a substrate comprising magnetoresistive elements, the method comprising the steps of forming a lower shielding layer on the substrate and then forming an insulating layer on a portion of the substrate on which the lower shielding layer is not formed; grinding the surfaces of the insulating layer and the lower shielding layer to form the surfaces of the insulating layer and the lower shielding layer in the same plane; forming a lower gap layer on the lower shielding layer and the insulating layer; and forming a plurality of magnetoresistive elements each comprising a multilayer film exhibiting the magnetoresistive effect and electrode layers conducting to the multilayer film on a portion of the lower gap layer where the lower shielding layer is formed, and a processing monitor element having substantially the same structure as the magnetoresistive elements on a portion of the lower gap layer where the insulating layer is formed, so that these elements are arranged in a line.

The present invention further provides a method of manufacturing a substrate comprising magnetoresistive elements, the method comprising the steps of forming an upper gap layer on magnetoresistive elements and a monitor element which are formed on a lower gap layer; forming an upper shielding layer on a portion of the upper gap layer, which is formed on the magnetoresistive elements, without forming the upper shielding layer on a portion of the gap layer which is formed on the monitor element; forming a write gap layer on the upper shielding layer and the upper gap layer on which the upper shield layer is not formed; and forming a coil layer and an upper core layer on a portion the write gap layer where the upper shielding layer is formed.

The present invention further provides a method of processing the above-described substrate comprising magnetoresistive elements, the method comprising grinding the magnetoresistive elements and a monitor element from the ABS side in the height direction while measuring the direct-current resistance value between the electrode layers of the monitor element until a predetermined direct-current resistance value is obtained.

A magnetic head slider comprising a magnetoresistive element composed of a spin valve film (a GMR element) is formed, by various kinds of processing, from a wafer in which a plurality of magnetoresistive elements are formed.

The exposed surface of the magnetoresistive element formed in the slider is referred to as "the ABS side", which is opposed to a recording medium in reproducing signals from the recording medium. The direction perpendicular to the ABS side opposed to the recording medium, i.e., the direction away from the recording medium, is referred to as "the height direction". The length of the magnetoresistive element in the height direction is a very important dimension for determining the direct-current resistance of the magnetoresistive element.

In order to set the length of the magnetoresistive element in the height direction to a predetermined dimension by grinding (height setting processing) on the basis of the relation to the direct-current resistance, a monitor element having the same structure of the magnetoresistive element is formed in alignment with magnetoresistive elements formed on the substrate, and the ABS side of the magnetoresistive elements and the monitor element is subjected to height setting processing, while measuring the direct-current of the monitor element. At the time the predetermined direct-current resistance is obtained, height setting processing is finished to form the magnetoresistive elements each having a length in the height direction with the predetermined direct-current resistance.

However, at present, the thickness of each of the gap layers formed on and below the monitor layer decreases as the recording density increases, and thus smearing (sag) occurs in the shielding layers formed on and below the gap layers to be exposed from the ABS side in height setting processing. There is thus the problem of causing a short circuit between the monitor element and the shielding layers on the ABS side during measurement of direct-current resistance.

Particularly, in height setting processing, the ABS side of the monitor element is ground in the direction from the lower shielding layer formed below the monitor element to the upper shielding layer formed on the monitor element, and the thickness of the lower gap layer formed below the monitor element is actually smaller than the thickness of the upper gap layer formed above the monitor element.

Therefore, smearing in the lower shielding layer causes the great problem of readily producing electrical connection between the lower shielding layer and the monitor element on the ABS side.

Accordingly, in the present invention, the lower shielding layer conventionally formed below the monitor element is removed to appropriately prevent a short circuit in the monitor element during height setting processing. More preferably, the upper shielding layer conventionally formed on the monitor element is also removed.

Besides the lower gap layer and the upper gap layer, insulating layers are preferably formed on and below the monitor element with no shielding layer formed.

DESCRIPTION OF THE PREFERRED EMBODIMENT

Figure 1:
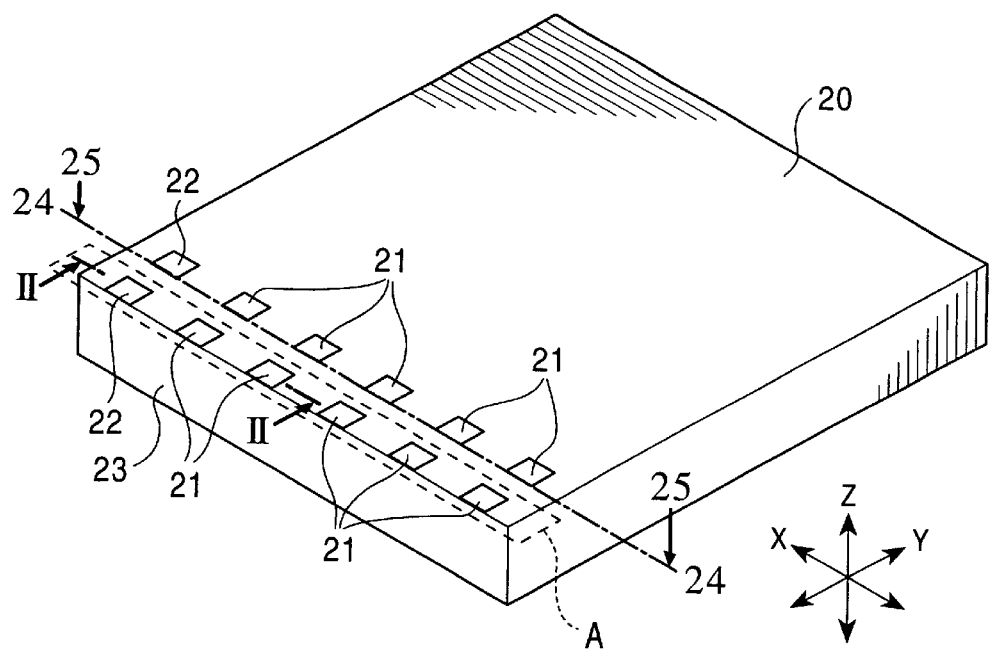
FIG. 1 is a perspective view showing the shape of a substrate having magnetoresistive elements in accordance with a first embodiment of the present invention.
Figure 2:
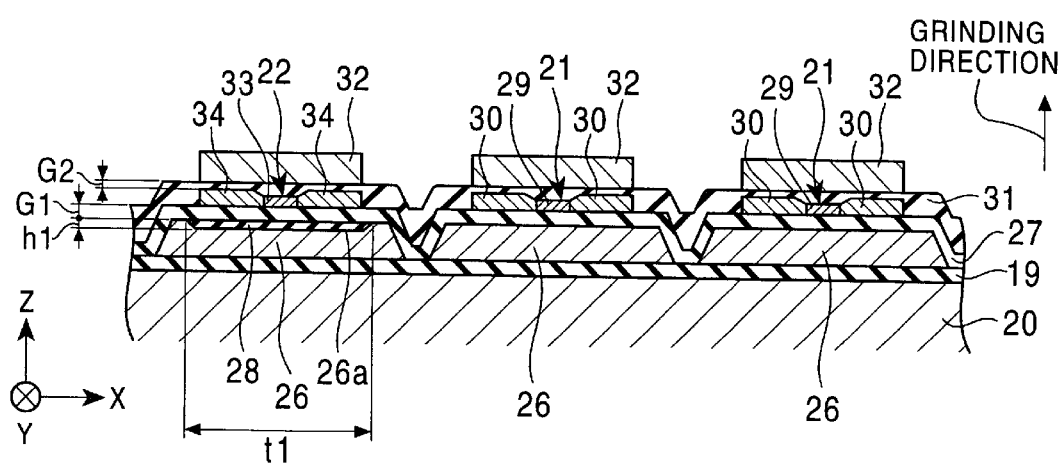
FIG. 2 is a partial sectional view taken along line II—II in FIG. 1.

FIG. 1 is a perspective view showing the shape of a substrate comprising magnetoresistive elements in accordance with the present invention, and FIG. 2 is a partial sectional view taken along line II—II in FIG. 1.

FIG. 1 shows a square block-shaped substrate 20 formed by processing a disk wafer made of $Al_2O_3$—TiC (alumina-titanium carbide) on which a plurality of magnetoresistive elements are formed.

Referring to FIG. 1, magnetoresistive elements 21 are formed on the substrate 20 at equal intervals in the X and Y directions shown in FIG. 1, and the leftmost magnetoresistive elements formed in the X direction serve as monitor elements 22.

Namely, as shown in FIG. 1, the plurality of magnetoresistive elements 21 and the monitor element 22 are formed in a line in the X direction shown in FIG. 1 to form a magnetoresistive element forming region A. The magnetoresistive element forming regions A comprising the plurality of magnetoresistive elements 21 and the monitor element 22 are provided in a plurality of lines on the substrate 20 in the Y direction shown in the drawing.

The front side 23 of the substrate 20 is referred to as "the ABS side (Air Bearing Surface)". In FIG. 1, the front structures of the plurality of magnetoresistive elements 21 and the monitor element 22, which constitute the hithermost magnetoresistive element forming region A in the Y direction are exposed from the ABS side 23.

The ABS side 23 is ground (height setting processing) by a predetermined dimensional amount, and then subjected to processing such as formation of rails (not shown), formation of a crown, etc., and then the substrate 20 is cut along the line 24 in the direction 25 shown in FIG. 1. The cut-out substrate 20 is referred to as a "slider bar" in which one magnetoresistive element forming region A comprising the plurality of magnetoresistive elements 21 and the monitor element 22 is formed. The slider bar is fixed to a holding jig, and cut between the respective magnetoresistive elements 21 to complete magnetic head sliders. The substrate (slider) comprising the monitor element 22 is finally removed without making a product.

As shown in FIG. 2, a base insulating layer 19 made of $Al_2O_3$ is formed on the substrate 20 made of $Al_2O_3$—TiC. A lower shielding layer 26 made of, for example, a NiFe alloy (permalloy) is formed on the base insulating layer 19. Furthermore, a lower gap layer 27 made of an insulating material such as $SiO_2$, $Al_2O_3$ (alumina), $Ti_2O_3$, TiO, $WO_3$, $Si_3N_4$, AlN, or the like, and having a gap length GI is formed on the lower shielding layer 26. The plurality of magnetoresistive elements 21 and the monitor element 22 are formed on the lower gap layer 27 so that they are arranged in a line in the X direction (the direction of the ABS side).

As shown in FIG. 2, each of the magnetoresistive elements 21 comprises a multilayer film 29 comprising a GMR element using a giant magnetoresistive effect, for example, such as a spin valve film, or the like, or an AMR element using an anisotropic magnetoresistive effect, hard bias layers (not shown) formed on both sides of the multilayer film 29, and electrode layers 30 made of Cr (chromium) and conducting to the multilayer film 29. The monitor element 22 has the same structure as the magnetoresistive elements 21.

As shown in FIG. 2, an upper gap layer 31 made of an insulating material such as $SiO_2$, $Al_2O_3$ (alumina), $Ti_2O_3$, TiO, $WO_{31}$ $Si_3N_4$, AlN, or the like, and having a gap length G2 is formed on the magnetoresistive elements 21 and the monitor element 22. Furthermore, an upper shielding layer 32 made of an NiFe alloy or the like is formed on the upper gap layer 31.

The multilayer structure ranging from the lower shielding layer 26 to the upper shielding layer 32 corresponds to a reproduction head portion of a magnetic head product. For example, when the multilayer film 29 each of the magnetoresistive elements 21 comprises a spin valve l film, a magnetic field enters from a recording medium in the direction perpendicular to the drawing of FIG. 2 to change magnetization of a free magnetic layer which constitutes the spin valve film, changing a direct-current resistance due to the relation between fixed magnetization of a pinned magnetic layer which constitutes the spin valve layer, and variable magnetization of the free magnetic layer to reproduce a recording magnetic field.

The magnetic head product may be a so-called combination type thin film magnetic head comprising not only a reproduction head but also a writing inductive head. In this case, the writing inductive head comprising a coil and a core is formed on the upper shielding layer 32 shown in FIG. 2. However, since a portion finally used for magnetic heads is formed in a region on the substrate 20 where the magnetoresistive elements 21 are formed, the inductive head need not be formed on the monitor element 22 which is not formed in a product.

Referring to FIG. 2, a recessed portion 26a having a predetermined depth h1 and a width t1 larger than the monitor element 22 is formed in a portion of the surface of the lower shielding layer 26, which is below the monitor element 22. In the recessed portion 26a is formed an insulating layer 28 made of an insulating material such as $SiO_2$, $Al_2O_3$ (alumina), $Ti_2O_3$, TiO, $WO_3$, $Si_3N_4$, AlN, or the like.

In the present invention, the surfaces of the insulating layer 28 and the lower shielding layer 26 are preferably formed in the same plane.

The insulating layer 28 is formed to be exposed from the ABS side (the side opposed to the recording medium).

In the present invention, the distance between the monitor element 22 and the lower shielding layer 26 is larger than that between the magnetoresistive elements 21 and the lower shielding layer 26 according to the shape of the insulating layer 28.

In the present invention, the total thickness of the thickness h1 of the insulating layer 28 and the thickness (the gap length) G1 of the lower gap layer 27 is preferably 700 angstroms or more.

Figure 3:
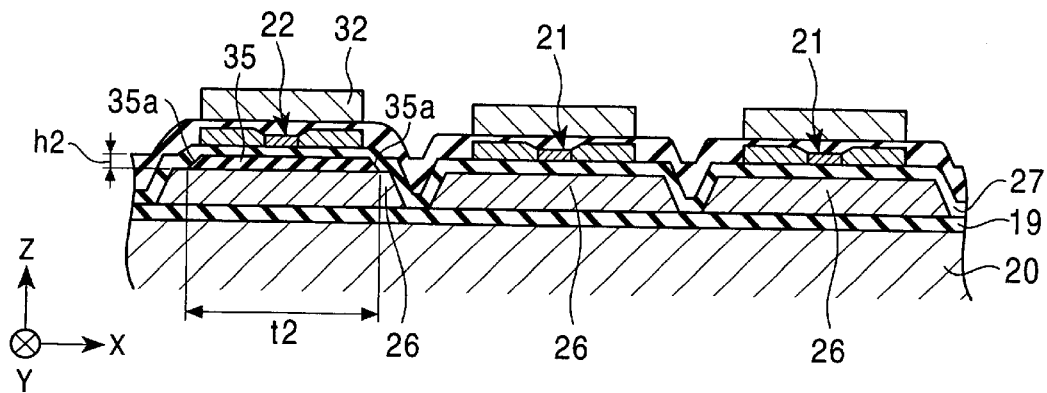
FIG. 3 is a partial sectional view showing the structure of a substrate in accordance with a second embodiment of the present invention.

FIG. 3 is a partial sectional view showing a substrate in accordance with a second embodiment of the present invention.

In the embodiment shown in FIG. 3, an insulating layer 35 having a predetermined thickness h2 and a width t2 larger than the width of a monitor element 22 is formed on a portion of a lower shielding layer 26 where the monitor element 22 is formed.

The insulating layer 35 must be made of an insulating material which permits plasma etching (isotropic etching) or RIE etching (anisotropic etching) as described below. In the present invention, therefore, the insulating layer 35 is made of an insulating material such as $SiO_2$, $Ta_2O_5$, TiO, $WO_3$, $Al_2O_3$, $Si_3N_4$, AlN, or the like.

As shown in FIG. 3, inclined surfaces 35a are preferably formed on the sides of the insulating layer 35.

A lower gap layer 27 is formed on the insulating layer 35 and the lower shielding layer 26.

As shown in FIG. 3, the monitor element 22 is formed on a portion of the lower gap layer 27 where the insulating layer 35 is formed, and thus the distance between the monitor element 22 and the lower shielding layer 26 is larger than that between magnetoresistive elements 21 and the lower shielding layer 26.

In the present invention, the total thickness of the thickness h2 of the insulating layer 35 and the thickness (the gap length) G1 of the lower gap layer 27 is preferably 3700 angstroms or more. The insulating layer 35 is formed to be exposed from the ABS side (the side opposite to the recording medium).

Figure 4:
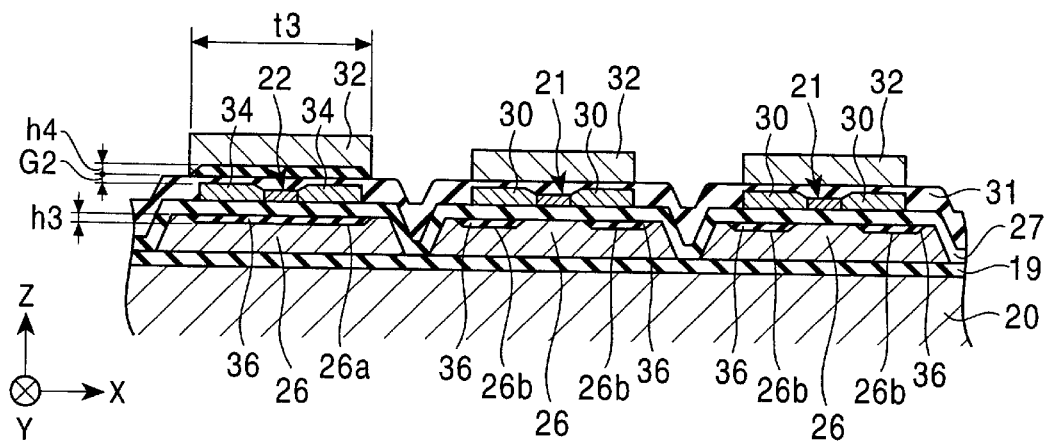
FIG. 4 is a partial sectional view showing the structure of a substrate in accordance with a third embodiment of the present invention.
Figure 5:
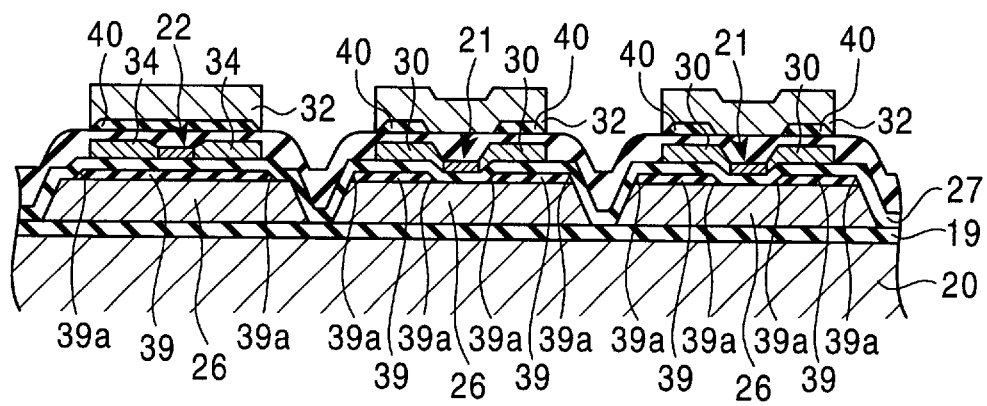
FIG. 5 is a partial sectional view showing the structure of a substrate in accordance with a fourth embodiment of the present invention.

FIGS. 4 and 5 are partial sectional views showing substrates in accordance with third and fourth embodiments, respectively, of the present invention.

In the embodiment shown in FIG. 4, an insulating layer 36 formed below a monitor element 22 is also formed below electrode layers 30 of magnetoresistive elements 21.

As shown in FIG. 4, recessed portions 26b having a predetermined depth h3 are formed in the surface of the lower shielding layer 26 not only below the monitor element 22 but also below the electrodes 30 of the magnetoresistive elements 21. The insulating layer 36 made of $Al_2O_3$, $SiO_2$, or the like is formed in the recessed portions 26b. In the present invention, the total thickness of the thickness h3 of the insulating layer 36 and the thickness (the gap length) G1 of the lower gap layer 27 is preferably 700 angstroms or more. Although the insulating layer 36 formed below the monitor element 22 is formed to be exposed from the ABS side, the insulating layer 36 formed below the electrode layers 30 of the magnetoresistive elements 21 may be either exposed or not from the ABS side.

For example, the insulating layer 36 formed below the magnetoresistive elements 21 lies in the range shown by a dotted line in FIG. 6.

Figure 6:
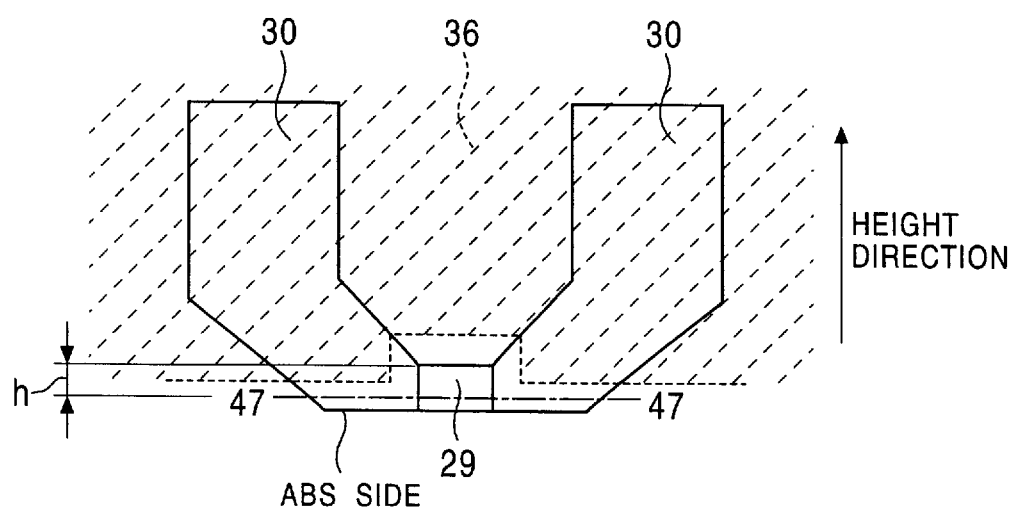
FIG. 6 is a plan view of a magnetoresistive element.

FIG. 6 is a top view showing the shape of each of the magnetoresistive elements 21. As shown in FIG. 6, the electrode layers 30 formed on both sides of a multilayer 29 are formed to extend rearward (in the height direction) from the ABS side. As shown in FIG. 6, the insulating layer 36 formed in the range shown by a dotted line is not formed below the multilayer film 29. This is because with the insulating layer 36 formed below the multilayer film 29, the distance between the multilayer film 29 and the lower shielding layer 26 is substantially increased to increase the gap length G1, thereby failing to comply with increases in recording density.

The reason why the insulating layer 36 is also provided below the electrode layers 30 of the magnetoresistive elements 21, as shown in FIG. 4, is that with the lower gap layer 27 having a smaller thickness (gap length G1), the rear sides of the electrode layers 30 formed to have a large width as shown in FIG. 6 and the lower shielding layer 26 are readily electrically connected due to the occurrence of pin holes in the lower gap layer 27. As described above, the insulating layer 36 may be formed to the ABS side so that it is exposed from the ABS side.

As shown in FIG. 4, an upper gap layer 31 having a thickness (gap length) G2 is formed on the magnetoresistive elements 21 and the monitor element 22. In the present invention, an insulating layer 38 is further formed on the monitor element 22 with the upper gap layer 31 held therebetween. The insulating layer 38 is formed to have a thickness h4 and a size which covers at least the plane size of the monitor element 22. As shown in FIG. 4, the insulating layer 38 is formed to have a width t3 larger than the width of the monitor elements.

By providing the insulating layer 38 on the upper gap layer 31, the distance between the monitor element 22 and the upper shielding layer 32 is increased, thereby appropriately maintaining electrical insulation between the monitor element 22 and the upper shielding layer 32 on the ABS side even when smearing (sag) occurs in the electrode layers 34 exposed from the ABS side of the monitor element 22 during grinding of the ABS side. In the present invention, the total thickness of the thickness h4 of the insulating layer 38, and the thickness (the gap length) G2 of the upper gap layer 31 is preferably 700 angstroms or more.

The insulating layer 38 is formed to be exposed from the ABS side.

In the embodiment shown in FIG. 5, like in the embodiment shown in FIG. 4, an insulating layer 39 formed on the lower shielding layer 26 is formed not only under the monitor element 22 but also below the electrode layers of the magnetoresistive elements 21.

When the insulating layer 39 is formed by plasma etching (isotropic etching) or RIE etching (anisotropic etching), in the present invention, the insulating layer 39 is made of an insulating material such as $SiO_2$, $T_5$, $O_5$, TiO, $WO_3$, $Al_2O_3$, $Si_3N$, AlN, or the like. When the insulating layer 39 is formed by a lift off method, it may be made of any insulating material.

As shown in FIG. 5, inclined surfaces 39a are preferably formed on the sides of the insulating layer 39.

Particularly, in the embodiment shown in FIG. 5, the insulating layer 39 is also formed under the electrode layers 30 of the magnetoresistive elements 21, not formed below the multilayer films 29 of the magnetoresistive elements 21, to form steps in a portion where each of the magnetoresistive elements 21 is formed, due to formation of the insulating layer 39. Therefore, in order to improve the pattern precision of formation of the magnetoresistive elements 21, therefore, the inclined surfaces 39a are preferably formed on the sides of the insulating layer 39

As shown in FIG. 5, an upper gap layer 31 is formed on the magnetoresistive elements 21 and the monitor element 22, and an insulating layer 40 is further formed on the upper gap layer 31. The insulating layer 40 is formed not only on the monitor element 22 but also on the electrode layers 30 of the magnetoresistive elements 21. Although the insulating layer 40 on the monitor element 22 is formed to be exposed from the ABS side, the insulating layer 40 formed on the electrode layers 30 of the magnetoresistive elements 21 may be either exposed or not from the ABS side.

Even when smearing (sag) occurs in the electrode layers 34 of the monitor element 22, which are exposed from the ABS side, during grinding of the ABS side, electrical insulation between the magnetoresistive elements 21 and the upper shielding layer 32 can be appropriately maintained on the ABS side due to the formation of the insulating layer 40.

At the same time, electrical insulation between the electrode layers 30 and the upper shielding layer 32 in the magnetoresistive elements 21 can appropriately be maintained.

In the present invention, the total thickness of the thickness of the insulating layer 39, and the thickness (the gap length) G1 of the lower gap layer 27, and the total thickness of the thickness of the insulating layer 40, and the thickness (the gap length) G2 of the upper gap layer 31 are preferably 700 angstroms or more.

As described above, in the present invention, besides the lower gap layer 27 formed between the lower shielding layer 26 and the monitor element 22, the insulating layer is formed therebetween to increase the space between the lower shielding layer 26 and the monitor element 22. Therefore, even when smearing (sag) occurs in the lower shielding layer 26 exposed from the ABS side due to grinding of the ABS side, electrical insulation between the monitor element 22 and the lower shielding layer 26 on the ABS side can be appropriately maintained.

In the present invention, since the total thickness of the thickness of the lower gap layer 27 and the thickness of the insulating layer is 700 angstroms or more, electrical insulation between the monitor element 22 and the lower shielding layer 26 on the ABS side can be more appropriately maintained.

Next, the method of producing the layers below the monitor element 22 is described with reference to the drawings. First, formation of the insulating layer 28 shown in FIG. 2 by the lift off method is described.

Figure 7:
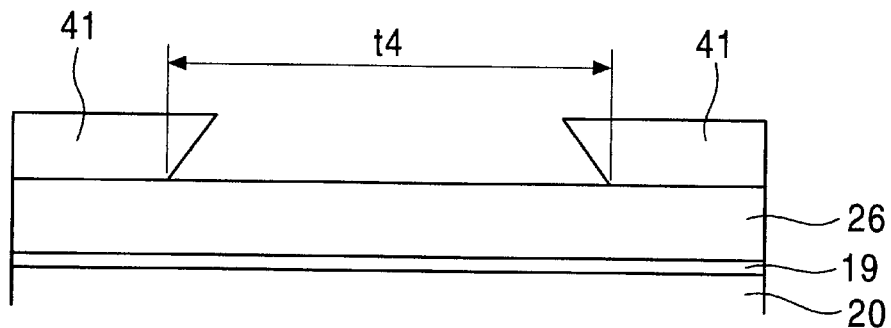
FIG. 7 is a drawing showing a step of a method of manufacturing a substrate having magnetoresistive elements in accordance with the present invention.

In the step shown in FIG. 7, the lower shielding layer 26 made of a magnetic material such as a NiFe alloy is formed on the base insulating layer 19 of $Al_2O_3$ formed on the substrate 20 of $Al_2O_3$—TiC (alumina-titanium carbide), and then resist layers 41 for lift off are formed with a predetermined distance t4 on the lower shielding layer 26. The predetermined distance t4 is larger than the width of the monitor element 22 formed in a subsequent step.

Figure 8:
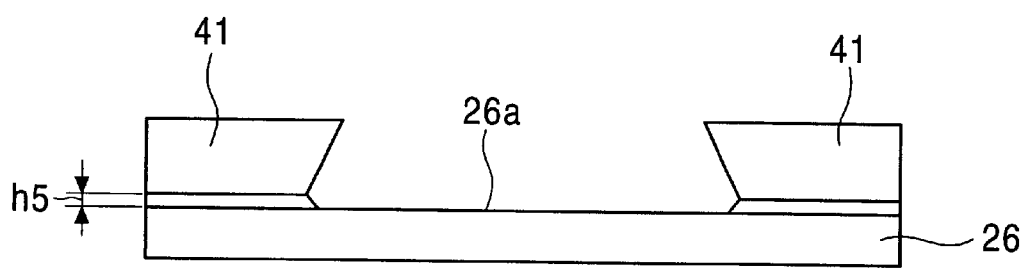
FIG. 8 is a drawing showing a step performed after the step shown in FIG. 7.

In the step show in FIG. 8, a portion of the surface of the lower shielding layer 26, which is not covered with the resist layers 41, is cut to a depth h5 by ion milling. In the step shown in FIG. 9, an insulating layer 42 made of an insulating material, for example, such as $Al_2O_3$ or $SiO_2$, is formed in the recessed portion 26a of the surface of the lower shielding layer 26 by sputtering or the like. At this time, the surface of the lower shielding layer 26 and the surface of the insulating layer 42 are preferably formed in the same plane.

Figure 9:
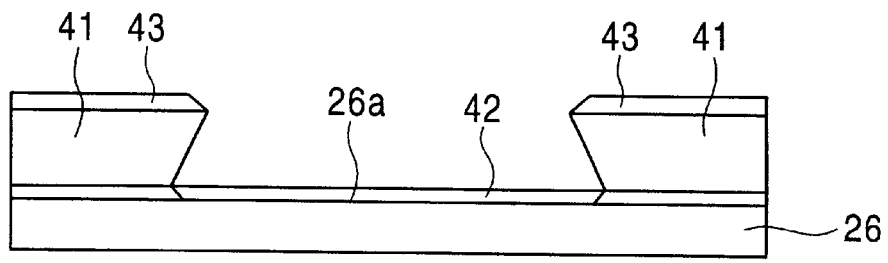
FIG. 9 is a drawing showing a step performed after the step shown in FIG. 8.

In the step shown in FIG. 9, an insulating material layer 43 is formed on the resist layers 41.

Figure 10:
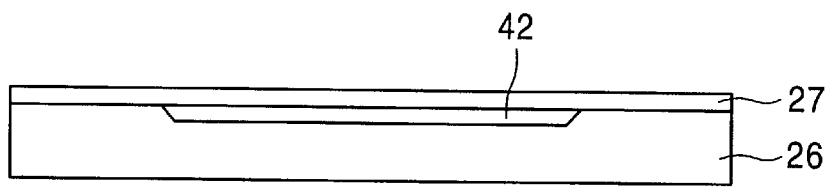
FIG. 10 is a drawing showing a step performed after the step shown in FIG. 9.

In the step shown in FIG. 10, the resist layers 41 are removed by lift off, and the lower gap layer 27 made of an insulating material such as such as $Al_2O_3$ or $SiO_2$ is formed on the surfaces of the lower shielding layer 26 and the insulating layer 42.

Figure 11:
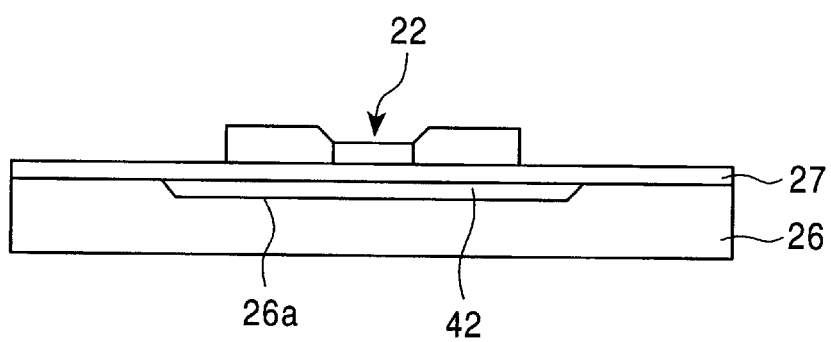
FIG. 11 is a drawing showing a step performed after the step shown in FIG. 10.

As shown in FIG. 11, the monitor element 22 is formed by patterning on the insulating layer 42 formed in the recessed portion 26a of the lower shielding layer 26 with the lower gap layer formed therebetween.

In the step shown in FIG. 11, the plurality of magnetoresistive elements 21 are formed on a portion of the lower gap layer 27 where the insulating layer 42 is not formed, at the same time that the monitor element 22 is formed. At this time, the plurality of magnetoresistive =elements 21 and the monitor element 22 are formed to be arranged in a line.

The recessed portion 26a formed in the surface of the lower shielding layer 26 shown in FIG. 8 may be also formed at positions where the electrode layers 30 of each of the magnetoresistive elements 21 are formed, and the insulating layer 42 is formed in the recessed portions 26a so that in the magnetoresistive elements formed by patterning at the same time as the monitor element 22, the multilayer films 29 using the magnetoresistive effect are formed on the lower gap layer 27, and the electrode layers 30 are formed on the portions of the lower gap layer 27 where the insulating layer 42 is formed.

The recessed portions 26a formed in the surface of the lower shielding layer 26 may be also formed under the electrode layers 30 formed behind the multilayer films 29 of the magnetoresistive elements 21 which are formed by patterning at the same time as at least the monitor element 22, and the-insulating layer 42 may be formed in the recessed portions 26a.

Another production method of the present invention will be described with reference to FIGS. 12 to 15.

Figure 12:
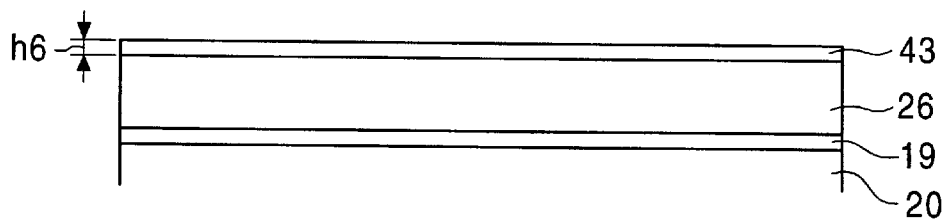
FIG. 12 is a drawing showing a step of a second method of manufacturing a substrate having magnetoresistive elements in accordance with the present invention.

In the step shown in FIG. 12, an insulating material layer 43 made of any one of insulating materials such as $SiO_2$, $Ta_2O_5$, TiO, $WO_3$, $Al_2O_3$, $Si_3N_4$, AlN, and the like is formed on the insulating layer 19 of $Al_2O_3$ or the like formed on the $Al_2O_3$—TiC (alumina-titanium carbide) substrate 20.

Figure 13:
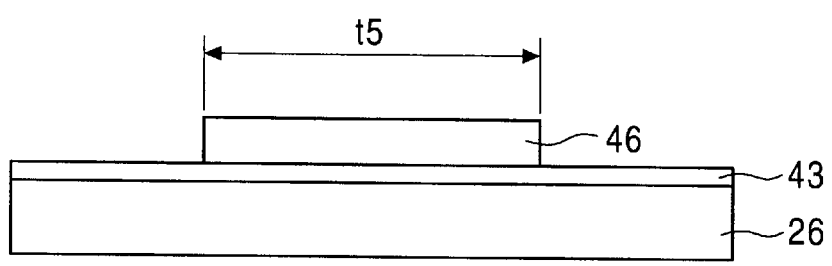
FIG. 13 is a drawing showing a step performed after the step shown in FIG. 12.

As shown in FIG. 13, a resist layer 46 having a predetermined width t5 is formed on the insulating material layer 43. The width t5 is smaller than the width of a monitor element which is formed in a subsequent step.

Figure 14:
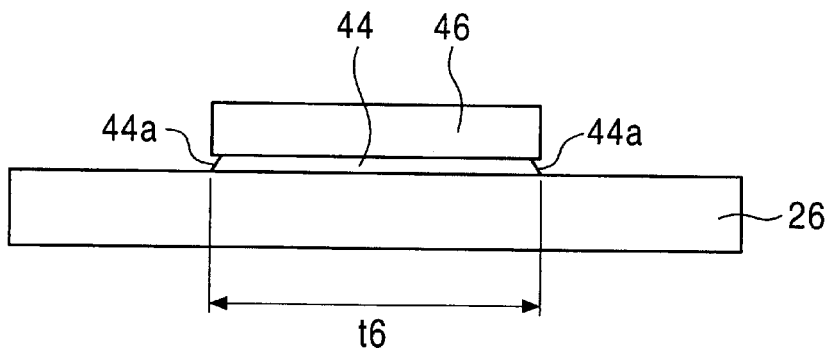
FIG. 14 is a drawing showing a step performed after the step shown in FIG. 13.

In the step shown in FIG. 14, a portion of the insulation material layer 43 which is not covered with the resist layer 46 is removed by isotropic etching (plasma etching) with $CF_4$ gas, $BCl_3$ gas, or the like.

The insulating materials such as $SiO_2$, $Ta_2O_5$, TiO, $WO_3$, $Al_2O_{31}$ and $Si_3N_4$ can be etched by isotropic etching with $CF_4$ gas, and etching with $CF_4$ gas causes no damage to the surface of the lower shielding layer 26 made of permalloy or the like.

The insulating materials such as $Al_2O_3$ and AlN can be etched with $BCl_3$ gas. Although this etching influences the surface of the lower shielding layer 26, the etching rate can be appropriately controlled to prevent etching of the surface of the lower shielding layer 26.

In addition, in isotropic etching, the corroded portion of the surface of the lower shielding layer 26 can be appropriately removed by washing so that the insulating material layer 43 can be patterned without etching damage to the lower shielding layer 26.

The insulating material layer 43 left below the resist layer 46 is left as an insulating layer 44. The width t5 of the insulating layer 44 is larger than the width of the monitor element 22 which is formed in a subsequent step.

Since the insulating layer 44 is formed by isotropic etching, inclined surfaces 44a are formed on the sides of the insulating layer 44, as shown in FIG. 14.

Figure 15:
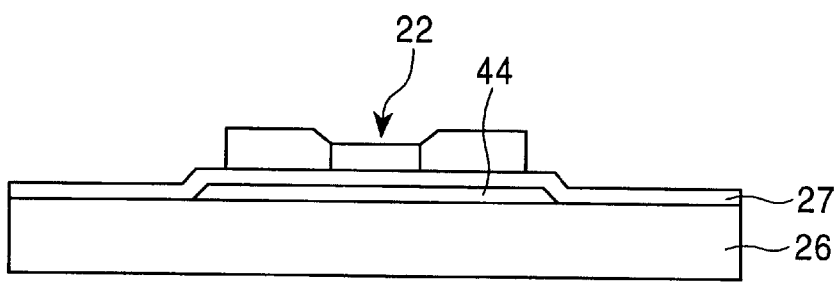
FIG. 15 is a drawing showing a step performed after the step shown in FIG. 14.

The resist layer 46 formed on the insulating layer 44 is removed, and a lower gap layer 27 is further formed on the insulating layer 44 and the lower shielding layer 26, as shown in FIG. 15. Then, the monitor element is formed on the insulating layer 44 by patterning, with the lower gap layer formed therebetween, as shown in FIG. 15.

FIGS. 16 to 19 show another production method of the present invention.

Figure 16:
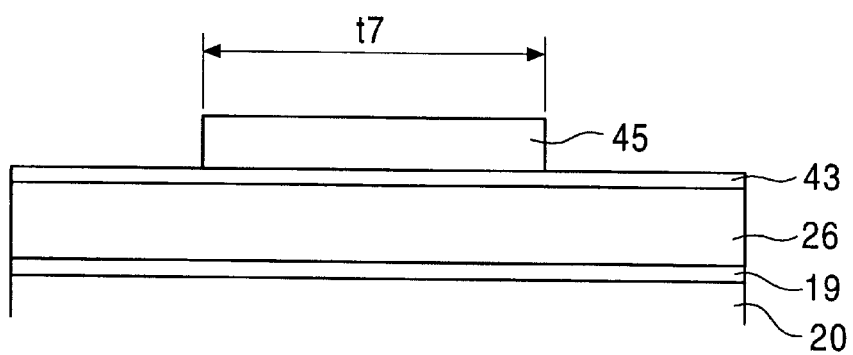
FIG. 16 is a drawing showing a step of a third method of manufacturing a substrate having magnetoresistive elements in accordance with the present invention.

In FIG. 16, an insulating material layer 43 made of any one of insulating materials such as $SiO_2$, $Ta_2O_5$, TiO, $WO_3$, $Al_2O_{31}$ $Si_3N_4$, AlN, or the like is formed on the base insulating layer 19 of $Al_2O_3$ or the like formed on the $Al_2O_3$—TiC (alumina-titanium carbide) substrate 20, and a resist layer 45 having a predetermined width t7, which is smaller than the width of a monitor element which is formed in a subsequent step, is formed on the insulating material layer 43.

Figure 17:
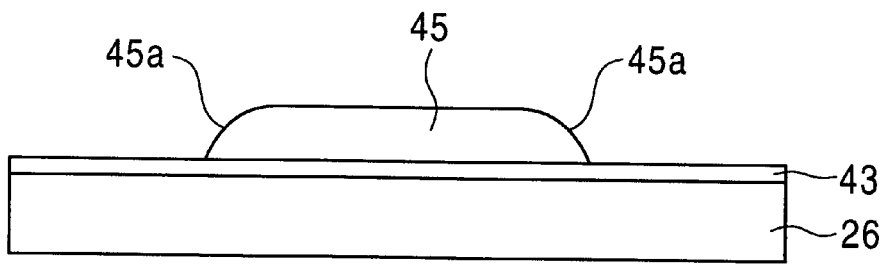
FIG. 17 is a drawing showing a step performed after the step shown in FIG. 16.

In the step shown in FIG. 17, the resist layer 45 is heat-treated. In this heat treatment, the sides of the resist layer 45 are sagged to form inclined surfaces 45a on the sides, as shown in FIG. 17.

Figure 18:
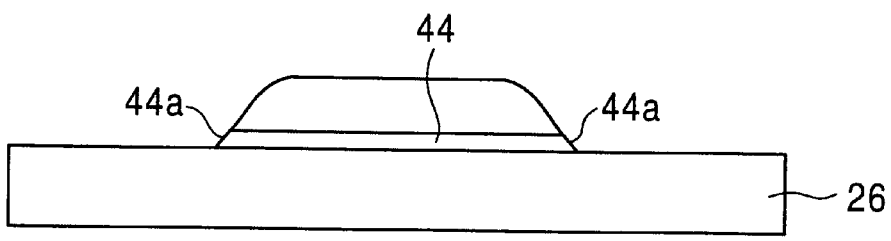
FIG. 18 is a drawing showing a step performed after the step shown in FIG. 17.
Figure 19:
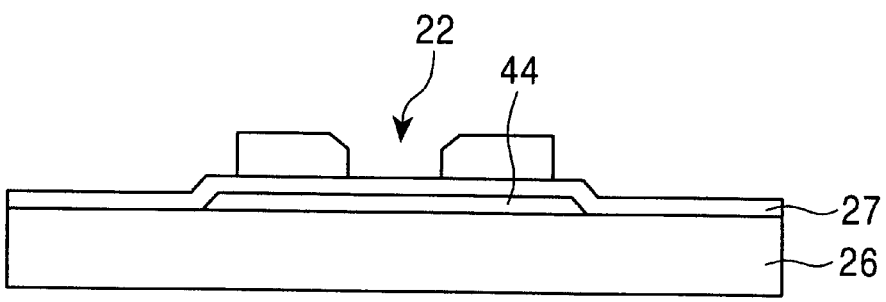
FIG. 19 is a drawing showing a step performed after the step shown in FIG. 18.

In the step shown in FIG. 18, a portion of the insulation material layer 43 which is not covered with the resist layer 45 is removed by anisotropic etching, e.g., RIE etching, with $CF_4$ gas, $BCl_3$ gas, or the like.

The insulating materials such as $SiO_2$, $Ta_2O_5$, TiO, $WO_{31}$ $Al_2O_{31}$ $Si_3N_4$ and AlN can be etched by anisotropic etching with $CF_4$ gas, and etching with $CF_4$ gas causes no damage to the surface of the lower shielding layer 26 made of permalloy or the like.

The insulating materials such as $Al_2O_3$ and AlN can be etched with $BCl_3$ gas. Although this etching influences the surface of the lower shielding layer 26, the etching rate can be appropriately controlled to prevent etching of the surface of the lower shielding layer 26.

After anisotropic etching (for example, RIE etching), the corroded portion of the surface of the lower shielding layer 26 can be appropriately removed by washing so that the insulating material layer 43 can be patterned without etching damage to the lower shielding layer 26.

The insulating material layer 43 left below the resist layer 45 is an insulating layer 44 having the inclined surfaces 44a formed on the sides thereof.

The reason for this is that the inclined surfaces 45a are formed on the sides of the resist layer 45 by heat treatment to decrease the thickness of the resist layer 45 of the inclined surfaces 45a, thereby cutting off the resist layer 45 of the inclined surfaces 45a due to the influence of etching according to the thickness of the inclined surfaces 45a. Therefore, since the resist layer 45 of the inclined surfaces 45a is cut off according to the thickness thereof, the sides of the insulating layer 44 formed below the inclines surfaces 45a of the resist layer 45 are also influenced by etching to form the inclined surfaces 44a.

Then, the resist layer 45 formed on the insulating layer 44 is removed, and the lower gap layer 27 is further formed on the insulating layer 44 and the lower shielding layer 26. Then, the monitor element 22 is formed on the insulating layer 44 with the lower gap layer 27 formed therebetween. At the same time that the monitor element 22 is formed, a plurality of magnetoresistive elements 21 are formed on a portion of the lower gap layer 27 where the insulating layer 44 is not formed. At this time, the plurality of magnetoresistive elements 21 and the monitor element 22 are formed to be arranged in a line.

In the production steps shown In FIGS. 12 to 15, or in the production steps shown in FIGS. 16 to 19, the insulating layer 44 is formed only below the monitor element 22. However, the insulating layer 44 shown in FIG. 14 or 18 may be also formed below the electrode layers 30 of the magnetoresistive elements 21 so that in the magnetoresistive elements 21 formed at the same time as the monitor element 22 in the step shown in FIG. 15 or 19, the multilayer films 29 using the magnetoresistive effect may be formed on the lower gap layer 27, and the electrode layers 30 may be formed on portions of the lower gap layer 27 where the insulating layer 44 is formed.

Particularly, the inclined surfaces 44a are preferably formed in the insulating layer 44 formed below the electrode layers 30 of the magnetoresistive elements 21. The formation of the inclined surfaces 44a permits patterning of the magnetoresistive elements 21 with high precision.

The insulating layer 44 may be also formed below the electrode layers 30 formed behind the multilayer films 29 of the magnetoresistive elements 21 patterned at the-same time as at least the monitor element 22.

Alternatively, the insulating layer 44 may be formed below the electrode layers 30 of the magnetoresistive elements 21 to be exposed from the ABS side.

An insulating layer is preferably formed on the upper gap layer 31 by the manufacturing steps shown in FIGS. 12 to 15 or FIGS. 16 to 19. When the insulating layer formed on the upper gap layer 31 is also formed on the electrode layers 30 of the magnetoresistive elements 21 formed at the same time as the monitor element 22, the insulating layer formed on the electrode layers 30 may be exposed from the ABS side.

In the present invention, height setting processing is performed by using the substrate comprising the monitor element 22 to set the DC resistance of the magnetoresistive elements 21 to a predetermined value.

The height setting processing of the present invention comprises grinding (height setting processing) the ABS side 23 shown in FIG. 1 while measuring the DC resistance between the electrode layers 34 of the monitor element 22.

By this grinding, the lengths of the magnetoresistive elements 21 and the monitor element 22 in the height direction are decreased to gradually increase the DC resistance between the electrode layers 34 of the monitor element 22.

For example, when the DC resistance of the monitor element 22 reaches the predetermined value at the time the ABS side 23 is ground to the one-dot chain line 47—47 shown in FIG. 6, the grinding is finished to obtain the magnetoresistive elements 21 each having a length in the height direction with the predetermined DC resistance.

Figure 20:
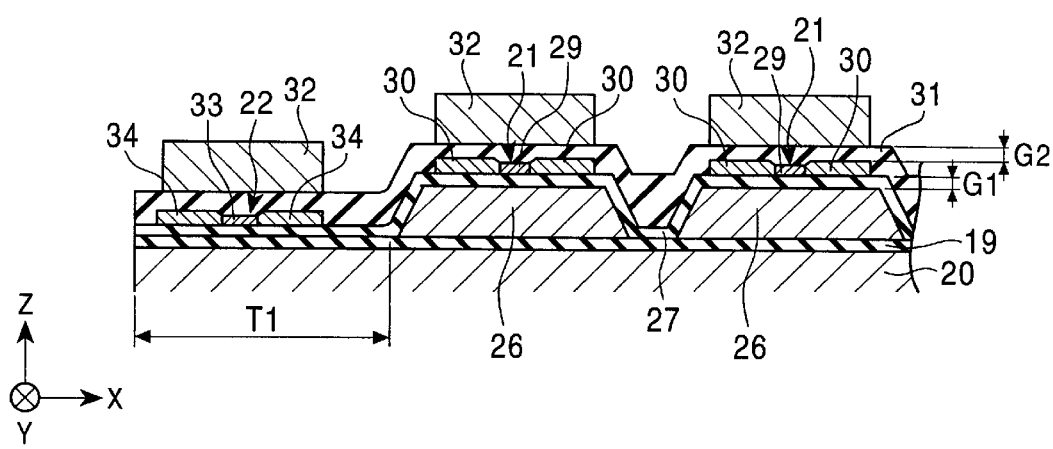
FIG. 20 is a partial sectional view showing the structure of a substrate in accordance with a fifth embodiment of the present invention.

FIG. 20 is a partial sectional view showing a substrate in accordance with a fifth embodiment.

Referring to FIG. 20, a base insulating layer 19 of $Al_2O_3$ or the like is formed on a substrate 20 made of $Al_2O_3$—TiC. A lower shielding layer 26 made of, for example, a NiFe alloy (permalloy) is formed on the base insulating layer 19. The lower shielding layer 26 is formed on the base insulating layer 19 excluding a portion having a predetermined width T1.

As shown in FIG. 20, a lower gap layer 27 made of an insulating material such as $SiO_2$, $Al_2O_3$ (alumina), $Ti_2O_3$, $TiO$, $WO_3$, $AlN$, $Si_3N_4$, or the like, and having a gap length G1 is formed on the lower shielding layer 26 and the portion of the base insulating layer 19 having the width T1. A plurality of magnetoresistive elements 21 are formed on a portion of the lower gap layer 27 where the lower shielding layer 26 is formed, and a monitor element 22 is formed on a portion of the lower gap layer 27 where the lower shielding layer 26 is not formed, so that these elements are arranged in a line in the X direction (the direction of the ABS side).

As shown in FIG. 20, each of the magnetoresistive elements 21 comprises a multilayer film 29 comprising a GMR element using the giant magnetoresistive effect, for example, such as a spin valve film, or the like, or an AMR element using the anisotropic magnetoresistive effect, hard bias layers (not shown) formed on both sides of the multilayer film 29, and electrode layers 30 made of Cr (chromium) and conducting to the multilayer film 29. The monitor element 22 has the same structure as the magnetoresistive elements As shown in FIG. 20, an upper gap layer 31 made of an insulating material such as $SiO_2$, $Al_2O_3$ (alumina), $Ti_2O_3$, $TiO$, $WO_3$, $AlN$, $Si_3N_4$, or the like, and having a gap length G2 is formed on the magnetoresistive elements 21 and the monitor element 22. Furthermore, an upper shielding layer 32 made of an NiFe alloy or the like is formed on the upper gap layer 31.

The multilayer structure ranging from the lower shielding layer 26 to the upper shielding layer 32 corresponds to a reproduction head portion of a magnetic head product. For example, when the multilayer film 29 each of the magnetoresistive elements 21 comprises a spin valve film, a magnetic field enters from a recording medium in the direction perpendicular to the drawing of FIG. 20 to change magnetization of a free magnetic layer which constitutes the spin valve film, changing a direct-current resistance due to the relation between fixed magnetization of a pinned magnetic layer which constitutes the spin valve layer, and variable magnetization of the free magnetic layer to reproduce a recording magnetic field.

The magnetic head product may be a so-called combination type thin film magnetic head comprising not only a reproduction head but also a writing inductive head. In this case, the writing inductive head comprising a coil and a core is formed on the upper shielding layer 32 shown in FIG. 20. However, since a portion finally used for magnetic heads is formed in a region on the substrate 20 where the magnetoresistive elements 21 are formed, the inductive head need not be formed on the monitor element 22 which is not formed in a product.

In the present invention, the lower shielding layer 26 is not formed below the monitor element 22, and on the ABS side, the monitor element is formed on the substrate. 20 with the lower gap layer 27 held therebetween. Therefore, there is no conventional problem in which smearing (sagging) from the lower shielding layer causes electrical contact with the electrode layers 34 of the monitor element 22, thereby short circuiting the monitor element 22. Thus, height setting processing can be appropriately performed by using the monitor element 22.

Figure 21:
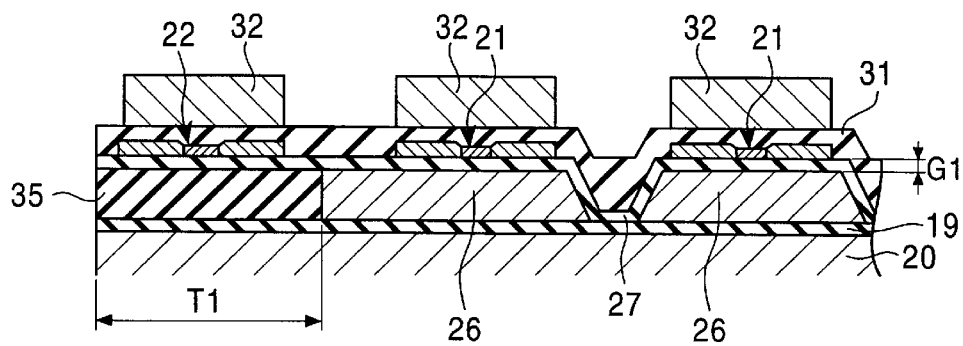
FIG. 21 is a partial sectional view showing the structure of a substrate in accordance with a sixth embodiment of the present invention.

FIG. 21 is a partial sectional view showing a substrate in accordance with a sixth embodiment of the present invention.

In the embodiment shown in FIG. 21, a lower shielding layer 26 is not formed a portion of a base insulating layer 19 which has a width T1 and where a monitor element 22 is formed. An insulating layer 35 made of the same insulating material as gap layers 27 and 31, such as $Al_2O_3$, $SiO_2$, $Ti_2O_3$, $TiO$, $WO_3$, $AlN$, $Si_3N_4$, or the like, or a different insulating material is formed on the portion of the base insulating layer 19 which has the width T1.

In the present invention, the surface of the insulating layer 35 and the surface of the lower shielding layer 26 formed on the substrate are preferably formed in the same plane. The surface of the insulating layer 35 and the surface of the lower shielding layer 26 can be formed in the same plane by using, for example, a CMP (chemical mechanical polishing) apparatus as described below.

As shown in FIG. 21, the lower gap layer 27 having a gap length G1 is formed on the lower shielding layer 26 and the insulating layer 35.

As shown in FIG. 21, a plurality of magnetoresistive elements 21 are formed on a portion of the lower gap layer 27 which is formed on the lower shielding layer 26, and a monitor element 22 is formed on a portion of the lower gap layer 27 which is formed on the insulating layer 35, so that these elements are arranged in a line in the X direction (the direction of the ABS side).

As shown in FIG. 21, besides the lower gap layer 27, the insulating layer 35 is formed below the monitor element 22, and the surface of the insulating layer and the surface of the lower shielding layer 26 are preferably formed in the same plane. This enables the formation of the monitor element 22 on a plane without a steep step.

Namely, like in the embodiment shown in FIG. 20, when the lower shielding layer 26 is not formed below the monitor element 22 so that the monitor element 22 is formed on the substrate 20 with the lower gap layer 27 formed therebetween, a steep step occurs between a plane where the monitor element 22 is formed, and a plane where the magnetoresistive elements 21 are formed. Therefore, there is the problem of deteriorating pattern precision in formation of the monitor element 22, and thus causing difficulties in forming the monitor element 22 and the magnetoresistive elements 21 in the same shape.

Therefore, as shown in FIG. 21, the insulating layer 35 is formed on a portion of the substrate 20 where the monitor element 22 is formed, and the surface of the insulating layer 35.and the surface of the lower shielding layer 26 are preferably formed in the same plane. This permits formation of the monitor element 22 and the magnetoresistive elements 21 in a plane with the same phase, permitting improvement in the pattern precision in formation of the monitor element 22.

Figure 22:
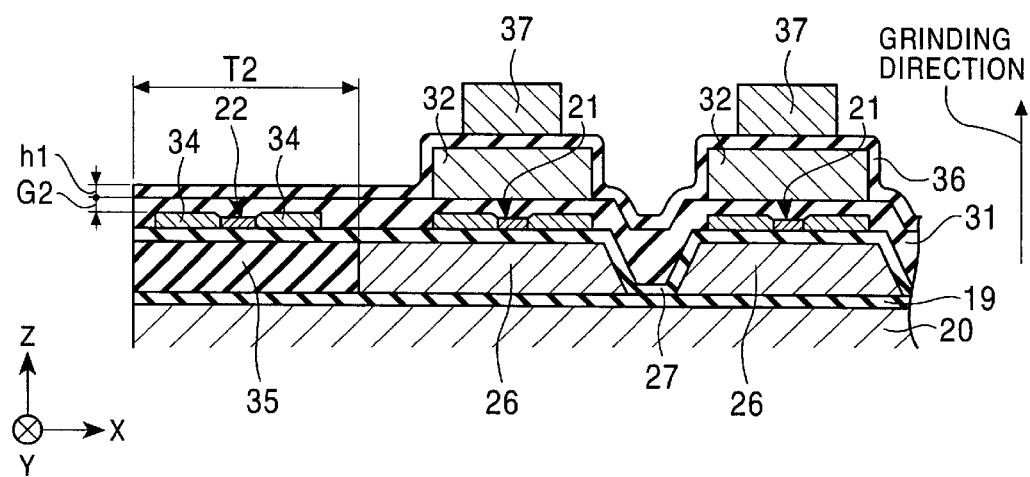
FIG. 22 is a partial sectional view showing the structure of a substrate in accordance with a seventh embodiment of the present invention.

FIG. 22 is a partial sectional view showing a substrate in accordance with a seventh embodiment of the present invention.

In this embodiment, an upper shielding layer 32 conventionally formed above a monitor element 22 is removed.

In FIG. 22, like in the embodiment shown in FIG. 21, an insulating layer 35 and a lower gap layer 27 are formed on a base insulating layer 19 and under a monitor element 22. However, the present invention is not limited to this structure, and as in the embodiment shown in FIG. 20, only the lower gap layer may be formed on the base insulating layer 19 and below the monitor element 22.

As shown in FIG. 22, an upper gap layer 31 having a gap length G2 is formed on a plurality of magnetoresistive elements 21 and the monitor element 22.

Furthermore, an upper shielding layer 32 is formed on the upper gap layer 31 excluding a portion above the monitor element 22, which has a width T2. Namely, in this embodiment, the upper shielding layer 32 is formed above the plurality of magnetoresistive element 21, but not formed above the monitor element 22.

Therefore, in FIG. 22, on the ABS side, the shielding layers 32 and 26 are not formed above and below the monitor element 22, thereby securely preventing a short circuit of the monitor element 22, as compared with the embodiments shown in FIGS. 20 and 21 in which the upper shielding layer 32 is formed above the monitor element 22. It is thus precisely perform the height setting processing using the monitor element 22.

Since the grinding direction in height setting processing on the ABS side is the direction from the lower shielding layer 26 to the upper shielding layer 32, as shown in FIG. 22, smearing (sag) produced in the electrode layers 34 of the monitor element 22 is possibly extended in the Z direction shown in FIG. 22. However, in the embodiment shown in FIG. 22, the upper shielding layer 32 is not formed above the monitor element 22, and thus smearing occurring in the electrode layers 34 causes less short circuit even when the smearing is extended in the Z direction shown in FIG. 22.

In the present invention, as shown in FIG. 22, a write gap layer 36 having a thickness of h1 is preferably formed on the upper shielding layer 32 and a portion of the upper gap layer 31 above the monitor element 22.

Since the write gap layer 36 is also formed on the portion of the upper gap layer 31 above the monitor element 22, the monitor element 22 is covered with the upper gap layer 31 having the gap length G2 and the write gap layer 36 having the thickness h1 so that the upper gap layer 31 and the write gap layer 36 play the role as a protecting layer for protecting the monitor element 22.

As described above, the monitor element 22 is a processing element for measuring DC resistance, and is thus not formed in product. Therefore, a writing inductive head is not formed on the monitor element 22.

However, in the embodiment shown in FIG. 22 in which the upper shielding layer 32 also functioning as a lower core layer of an inductive head is not formed on the monitor element, the following problem occurs.

As shown FIG. 22, the upper shielding layer 32 is formed on the magnetoresistive elements 21, and a coil layer (not shown) and an upper core layer 37, which constitute the inductive head, are further formed on the upper shielding layer 32. However, etching for forming the coil layer and the upper core layer 37 has an influence on the upper gap layer 31 formed on the monitor element 22 without the upper shielding layer 32 formed thereon. If the monitor element 22 is exposed by cutting the upper gap layer 31 due to the influence of etching, the monitor element 22 is also influenced by etching. Therefore, in the present invention, from the viewpoint of protection of the monitor element 22, the write gap layer 36 formed between the upper shielding layer (lower core layer) 32 and the upper core layer 37 is extended to the portion on the upper gap layer 31 above the monitor element 22 so as to prevent the monitor element 22 from being influenced by etching for forming the coil layer and the upper core layer 37.

The write gap layer is formed in the thickness h1 which is relatively large, and thus effectively functions as a protecting layer for protecting the monitor element 22.

Next, the method of producing the layers formed below the magnetoresistive elements 21 and the monitor element 22 in the present invention will be described below with reference to the drawings.

Figure 23:
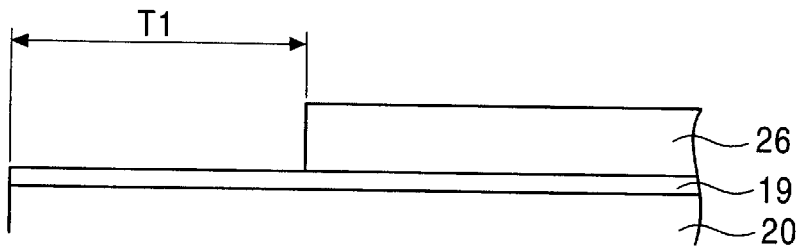
FIG. 23 is a drawing showing a step of a method of manufacturing a substrate having magnetoresistive elements in accordance with the present invention.

In the step shown in FIG. 23, the base insulating layer 19 of $Al_2O_3$ is formed on the substrate 20 of $Al_2O_3$—TiC (alumina-titanium carbide), and the lower shielding layer 26 made of a magnetic material such as a NiFe alloy is formed on the base insulating layer 19 excluding a portion having the width T1. The lower shielding layer 26 is formed by a frame plating method. The width T1 is larger than the width of the monitor element 22 formed in the subsequent step.

Figure 24:
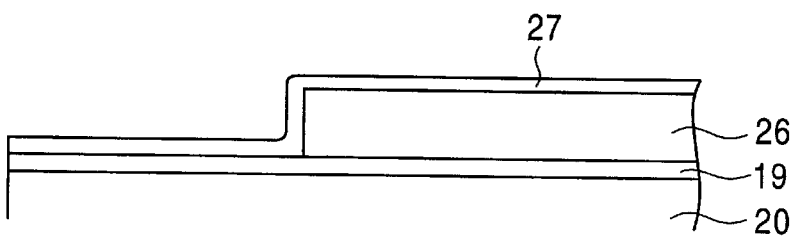
FIG. 24 is a drawing showing a step performed after the step shown in FIG. 23.
Figure 25:
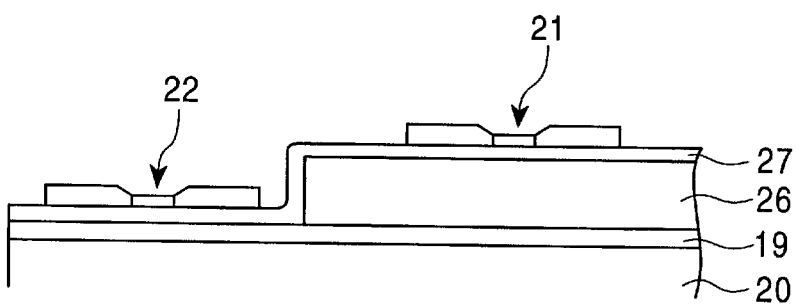
FIG. 25 is a drawing showing a step performed after the step shown in FIG. 24.

In the step shown in FIG. 24, the lower gap layer 27 made of an insulating material such as $Al_2O_3$ or $SiO_2$ is formed on the lower shielding layer 26 and the base insulating layer 19. In the step shown in FIG. 25, the plurality of magnetoresistive elements 21 are formed by patterning on a portion of the lower gap layer 27 where the lower shielding layer 26 is formed. At the same time that the magnetoresistive element 21 are formed, the monitor element 22 is formed on a portion of the lower gap layer 27 where the lower shielding layer 26 is not formed. At this time, the plurality of magnetoresistive elements 21 and the monitor element 22 are formed to be arranged in a line.

Next, another production method will be described below with reference to FIGS. 26 to 29.

Figure 26:
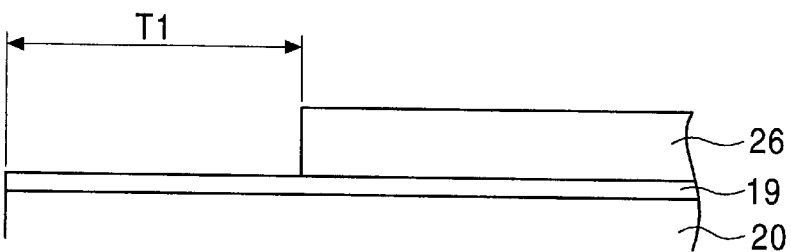
FIG. 26 is a drawing showing a step of a second method of manufacturing a substrate having magnetoresistive elements in accordance with the present invention.

In the step shown in FIG. 26, the base insulating layer 19 of $Al_2O_3$ is formed on the substrate 20 of $Al_2O_3$—TiC (alumina-titanium carbide), and the lower shielding layer 26 made of a magnetic material such as a NiFe alloy is formed on the base insulating layer 19 excluding a portion having the width T1. The lower shielding layer 26 is formed by a frame plating method. The width T1 is larger than the width of the monitor element 22 formed in a subsequent step.

Figure 27:
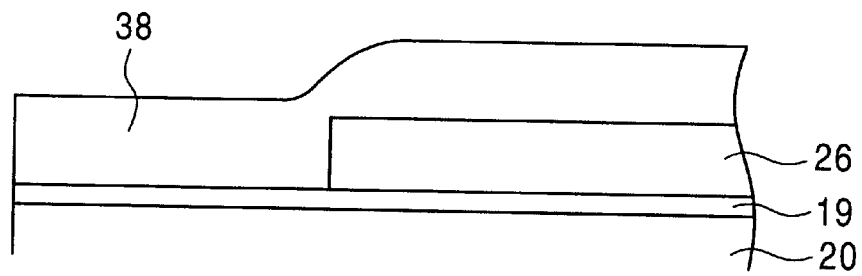
FIG. 27 is a drawing showing a step performed after the step shown in FIG. 26.

In the step shown in FIG. 27, an insulating layer 38 is formed on the portion of the base insulating layer 19 which has the width T1 and where the lower shielding layer 26 is not formed, and on the lower shielding layer 26. The thickness of the insulating layer 38 formed on the portion of the base insulating layer 19 which has the width T1 is preferably larger than the thickness of the lower shielding layer 26.

Figure 28:
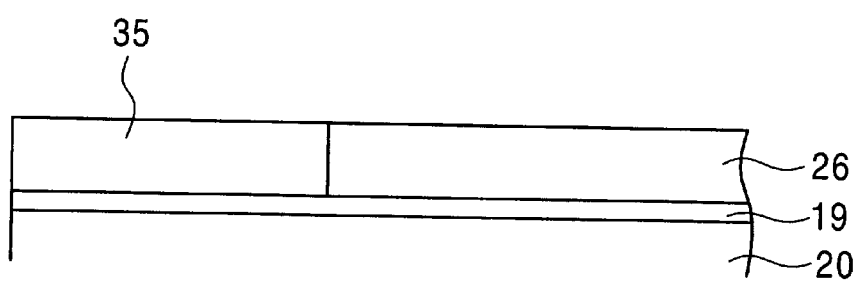
FIG. 28 is a drawing showing a step performed after the step shown in FIG. 27.

As shown in FIG. 28, the surface of the insulating layer 38 is cut off by CMP application, and the surface of the lower shielding layer 26 exposed by cutting the insulating layer 38 is also slightly cut off to form the insulating layer 35 having the same thickness as the lower shielding layer 26 adjacent to the lower shielding layer 26.

Figure 29:
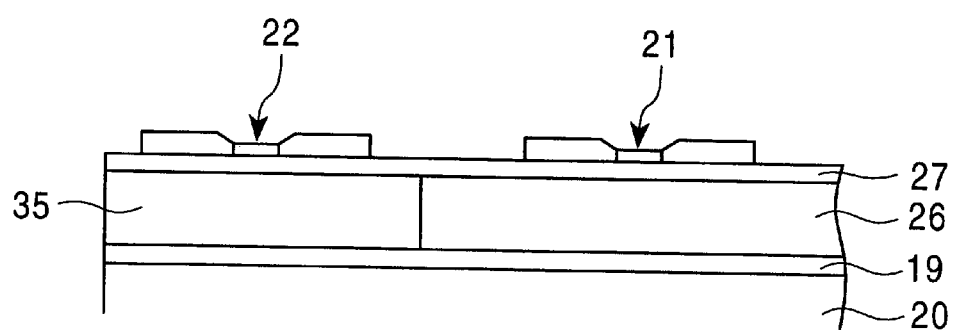
FIG. 29 is a drawing showing a step performed after the step shown in FIG. 28.

In the step shown in FIG. 29, the lower gap layer 27 is formed on the insulating layer 35 and the lower shielding layer 26. Then, the plurality of magnetoresistive elements 21 are formed by patterning on a portion of the lower gap layer 27 where the lower shielding layer 26 is formed. At the same time, the monitor element 22 is formed by patterning on a portion of the lower gap layer 27 where the insulating layer 35 is formed.

FIGS. 30 to 33 show the method of producing the layers formed above the magnetoresistive elements 21 and the monitor element 22 in the present invention.

Figure 30:
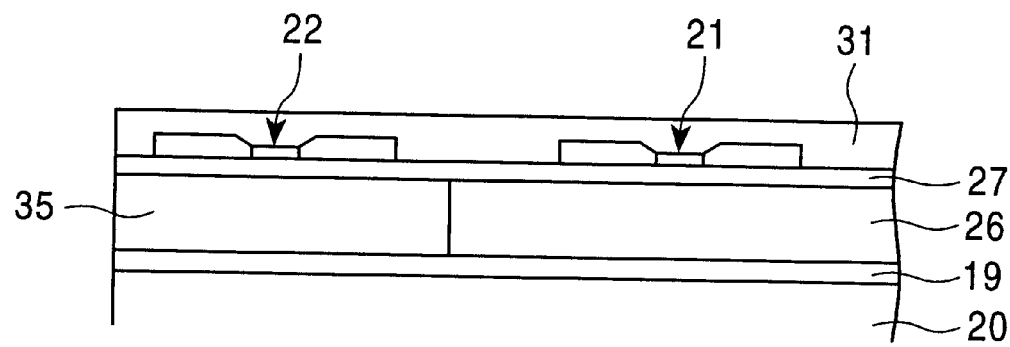
FIG. 30 is a drawing showing a step of a third method of manufacturing a substrate having magnetoresistive elements in accordance with the present invention.

In the step shown in FIG. 30, after the step shown in FIG. 29, the upper gap layer 31 made of an insulating material such as $Al_2O_3$, $SiO_2$, or the like is formed on the magnetoresistive elements 21 and the monitor element 22.

Figure 31:
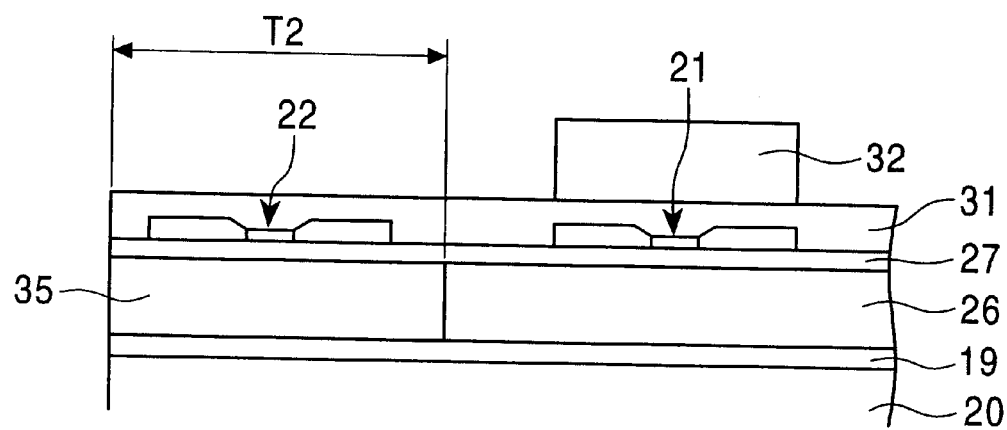
FIG. 31 is a drawing showing a step performed after the step shown in FIG. 30.

In the step shown in FIG. 31, the upper shielding layer 32 is formed on a portion of the upper gap layer 31 where the magnetoresistive elements 21 are formed, with a space having a width larger than the width of the monitor element 22. The upper shielding layer 32 is formed by the frame plating method.

Figure 32:
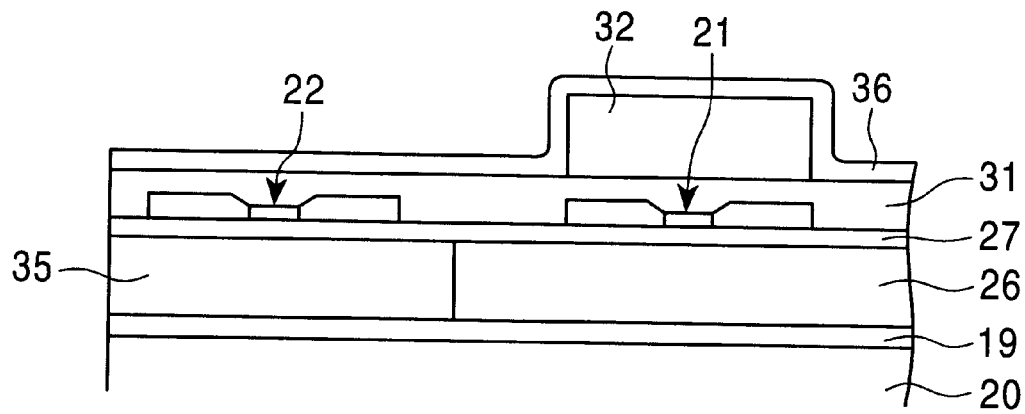
FIG. 32 is a drawing showing a step performed after the step shown in FIG. 31.

In the step shown in FIG. 32, the write gap layer 36 is formed on the upper shielding layer (lower core layer) 32 and a portion of the upper gap layer 31 where the upper shielding layer 32 is not formed.

Figure 33:
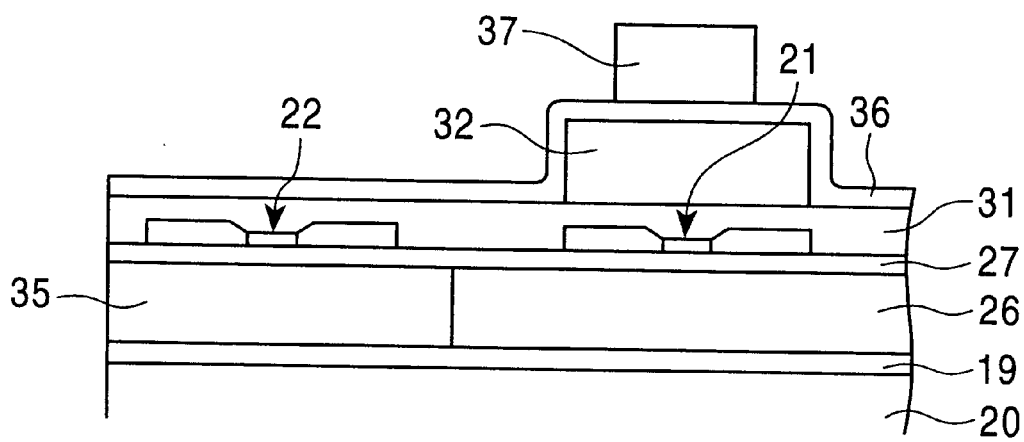
FIG. 33 is a drawing showing a step performed after the step shown in FIG. 32.
Figure 34:
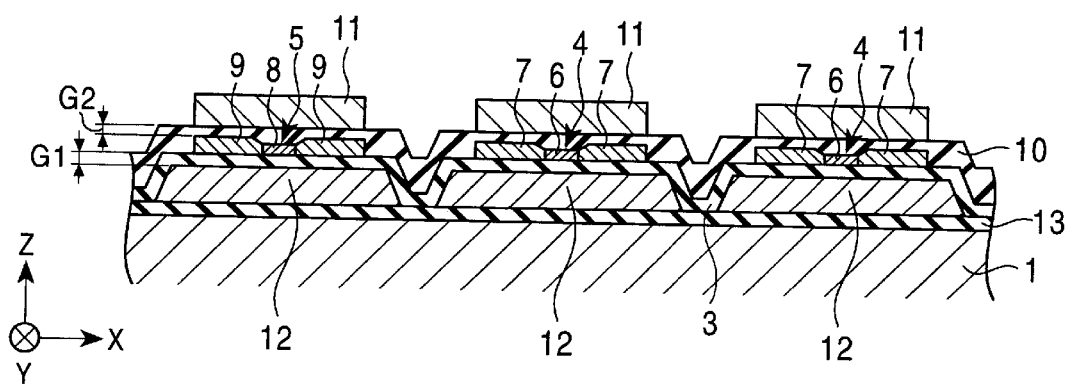
FIG. 34 is a partial sectional view showing the structure of a conventional substrate having magnetoresistive elements.
Figure 35:
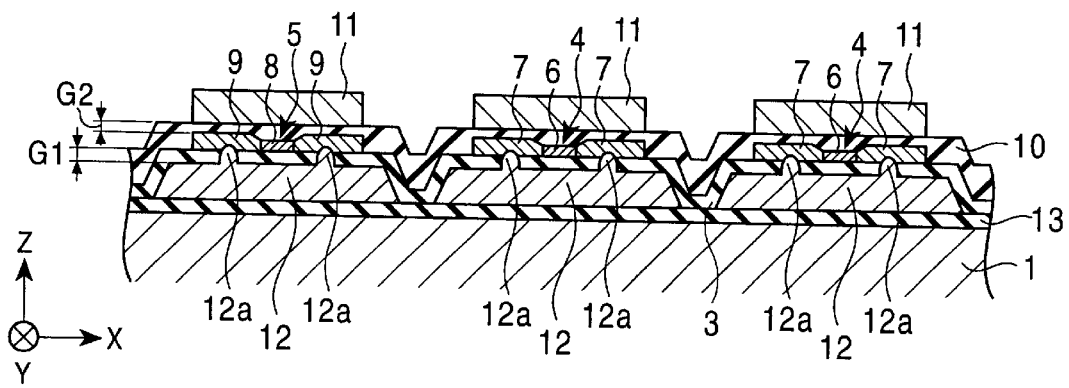
FIG. 35 is a partial sectional view showing a problem of a conventional substrate.

In the step shown in FIG. 33, the coil layer (not shown) is formed on the portion of the write gap layer 36 where the upper shield layer 32 is formed, and the upper core layer 37 is formed on the coil layer with an insulating layer (not shown) held therebetween. As shown in FIG. 33, on the ABS side, the upper core layer 37 is formed on the upper shielding layer 32 with the write gap layer 36 formed therebetween.

In the present invention, height setting processing is performed by using the substrate comprising the monitor element 22 to set the DC resistance of the magnetoresistive elements 21 to a predetermined value.

The height setting processing of the present invention comprises grinding (height setting processing) the ABS side 23 shown in FIG. 1 while measuring the DC resistance between the electrode layers 34 of the monitor element 22.

By this grinding, the lengths of the magnetoresistive elements 21 and the monitor element 22 in the height direction are decreased to gradually increase the DC resistance between the electrode layers 34 of the monitor element 22.

When the DC resistance of the monitor element 22 reaches the predetermined value by grinding the ABS side 23, the grinding is finished to obtain the magnetoresistive elements 21 each having a length in the height direction with the predetermined DC resistance.

As described above, in the present invention, besides the lower gap layer, the insulating layer is formed between the monitor element and the lower shielding layer to be exposed from the ABS side, thereby increasing the distance between the monitor element and the lower shielding layer, as compared with a conventional example. Therefore, even when smearing occurs in the lower shielding layer and/or the electrode layers of the monitor element, which are exposed from the ABS side, by grinding the ABS side, electrical insulation between the monitor element and the upper shielding layer on the ABS side can be appropriately maintained.

Where the total thickness of the lower shielding layer and the insulating layer formed between the monitor element and the upper shielding layer is 700 angstroms or more, electrical insulation between the monitor element and the upper shielding layer on the ABS side can be more appropriately maintained.

In the present invention, the insulating layer may be also formed below the electrode layers of the magnetoresistive elements as products. This permits maintenance of electrical insulation between the electrode layers in the magnetoresistive elements and the lower shielding layer even when the thickness of the lower gap layer is decreased.

In the present invention, the lower shielding layer conventionally formed is not formed below the monitor element to prevent a short circuit of the monitor element during height setting processing.

In the present invention, an insulating layer is preferably provided between the substrate and the lower gap layer formed below the monitor element, thereby precisely patterning the monitor element.

In the present invention, not only the lower shielding layer conventionally formed below the monitor element but also the upper shielding layer conventionally formed above the monitor element are not formed, preventing a short circuit of the monitor element in height setting processing.

Furthermore, a write gap layer of an inductive head is formed on the upper gap layer formed on the monitor element to appropriately protect the monitor element from etching for forming a coil layer on magnetoresistive elements.

What is claimed is:

1. A substrate having magnetoresistive elements, comprising:
    a lower shielding layer formed on a substrate,
    a lower gap layer formed on the lower shielding layer,
    a plurality of magnetoresistive elements each having a multilayer film exhibiting a magnetoresistive effect,
    electrode layers conducting to the multilayer film, and
    a processing monitor element having the same structure as the magnetoresistive elements, the magnetoresistive and processing monitor elements being arranged on the lower gap layer,
        wherein in addition to the lower gap layer, an insulating layer is formed between the monitor element and the lower shielding layer to be exposed from an air-bearing-surface (ABS) side, and the distance between the monitor element and the lower shielding layer on the ABS side is larger than that between the magnetoresistive elements and the lower shielding layer on the ABS side.

2. A substrate having magnetoresistive elements according to claim 1, wherein the total thickness of the lower gap layer and the insulating layer is 700 angstroms or more.

3. A substrate having magnetoresistive elements according to claim 1, wherein the insulating layer is formed on the lower shielding layer, and the lower gap layer is formed on the insulating layer so that the monitor element is formed on the lower gap layer.

4. A substrate having magnetoresistive elements according to claim 3, wherein a recessed portion is formed in the surface of the lower shielding layer, and the insulating layer is formed in the recessed portion so that the monitor element is formed on the insulating layer with the lower gap layer formed therebetween.

5. A substrate having magnetoresistive elements according to claim 4, wherein the surface of the insulating layer formed in the recessed portion of the lower shielding layer and the surface of the lower shielding layer are formed in the same plane.

6. A substrate having magnetoresistive elements according to claim 3, wherein the insulating layer is superposed on the surface of the lower shielding layer to form a step between the upper side of the insulating layer and the surface of the lower shielding layer so that inclined surfaces are formed on the sides of the insulating layer in the stepped portion.

7. A substrate having magnetoresistive elements according to claim 1, wherein the insulating layer comprises at least one of: $SiO_2$, $Ta_2O_5$, $TiO$, $Al_2O_3$, $Si_3N_4$, $AlN$, and $WO_3$.

8. A substrate having magnetoresistive elements according to claim 1, wherein the insulating layer is also formed below the electrode layers which respectively constitute the magnetoresistive elements except portions below the multilayer films which respectively constitute the magnetoresistive elements.

9. A substrate having magnetoresistive elements, comprising:

a lower shielding layer formed on a substrate, a lower gap layer formed on the lower shielding layer, a plurality of magnetoresistive elements each having a multilayer film exhibiting a magnetoresistive effect, electrode layers conducting to the multilayer film, a processing monitor element having the same structure as the magnetoresistive elements, the magnetoresistive and processing monitor elements being arranged on the lower gap layer, wherein in addition to an upper gap layer, an insulating layer is formed on the magnetoresistive elements and the monitor element to be exposed from an air-bearing-surface (ABS) side, and the distance between the monitor element and an upper shielding layer formed on the upper gap layer on the ABS side is larger than that between the magnetoresistive elements and the upper shielding layer on the ABS side.

10. A substrate having magnetoresistive elements according to claim 9, wherein the total thickness of the upper gap layer and the insulating layer is 700 angstroms or more.

11. A substrate having magnetoresistive elements according to claim 10, wherein the insulating layer is also formed above the electrode layers which respectively constitute the magnetoresistive elements except portions above the multilayer films which respectively constitute the magnetoresistive elements.

12. A substrate having magnetoresistive elements according to claim 8, wherein the insulating layer superposed on the electrode layers of the magnetoresistive elements is exposed from the ABS side.

13. A substrate having magnetoresistive elements, comprising a lower shielding layer formed on a substrate, a lower gap layer formed on the lower shielding layer, a plurality of magnetoresistive elements formed on the lower gap layer and each having a multilayer film exhibiting a magnetoresistive effect, and electrode layers conducting to the multilayer film, and a processing monitor element formed adjacent to the plurality of magnetoresistive elements and having the same structure as the magnetoresistive elements so that on an air-bearing-surface (ABS) side, the monitor element is formed on the substrate with the lower gap layer held therebetween, without the lower shielding layer.

14. A substrate having magnetoresistive elements according to claim 13, wherein an insulating layer is formed between the substrate and the lower gap layer formed below the monitor element.

15. A substrate having magnetoresistive elements according to claim 14, wherein the surface of the insulating layer and the surface of the lower shielding layer formed on the substrate are formed in the same plane.

16. A substrate having magnetoresistive elements according to claim 13, wherein an upper shielding layer formed on the-magnetoresistive elements with an upper gap layer formed therebetween is not formed on a portion of the upper gap layer which is formed on the monitor element on the ABS side.

17. A substrate having magnetoresistive elements according to claim 16, wherein a write gap layer of an inductive head is formed on the portion of the upper gap layer which is formed on the monitor element.

* * * * *